US010029499B2

(12) United States Patent
Koshigoe

(10) Patent No.: US 10,029,499 B2
(45) Date of Patent: Jul. 24, 2018

(54) PORTABLE PRINTER STORAGE CASE

(71) Applicant: SATO HOLDINGS KABUSHIKI KAISHA, Tokyo (JP)

(72) Inventor: Ikuo Koshigoe, Saitama (JP)

(73) Assignee: SATO HOLDINGS KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/303,148

(22) PCT Filed: Apr. 8, 2015

(86) PCT No.: PCT/JP2015/060948
§ 371 (c)(1),
(2) Date: Oct. 10, 2016

(87) PCT Pub. No.: WO2015/186425
PCT Pub. Date: Dec. 10, 2015

(65) Prior Publication Data

US 2017/0028756 A1 Feb. 2, 2017

(30) Foreign Application Priority Data

Jun. 4, 2014 (JP) ................................ 2014-115350

(51) Int. Cl.

| | |
|---|---|
| ***B41J 29/12*** | (2006.01) |
| ***B41J 29/13*** | (2006.01) |
| ***B41J 29/14*** | (2006.01) |
| ***B41J 15/04*** | (2006.01) |
| ***G06F 1/16*** | (2006.01) |
| ***H05K 5/00*** | (2006.01) |

(Continued)

(52) U.S. Cl.
CPC ................ *B41J 29/13* (2013.01); *B41J 3/36* (2013.01); *B65D 15/22* (2013.01)

(58) Field of Classification Search
CPC ... B29J 29/12; B29J 29/13; B29J 29/14; B29J 15/04
See application file for complete search history.

(56) References Cited

U.S. PATENT DOCUMENTS 7,287,850 B2 * 10/2007 Matsui ...................... B41J 3/36 347/108
7,825,944 B2 * 11/2010 Kaiya ...................... B41J 29/13 150/165

(Continued)

FOREIGN PATENT DOCUMENTS

JP 2002-199925 A 7/2002
JP 2004-276490 A 10/2004

(Continued)

*Primary Examiner* — Andrew T Kirsch
(74) *Attorney, Agent, or Firm* — Foley & Lardner LLP

(57) ABSTRACT

A storage case 30 for a portable printer according to an embodiment of the present invention includes: a case body 31 configured to store a portable printer 1; a lower cover 32 configured to open and close so as to cover the lower part of the front surface in which the ejection port M, which a label is ejected after printed therefrom in the portable printer 1, is provided; an upper cover 33 configured to open and close the upper part of the front surface of the portable printer 1; and a printer holder 35 that holds the portable printer 1 in the storage case 30. The printer holder 35 includes a pair of protrusions that protrude partially to the front side of the portable printer 1.

10 Claims, 27 Drawing Sheets

(51) Int. Cl.

| | |
|---|---|
| ***H05K 7/00*** | (2006.01) |
| ***B41J 3/36*** | (2006.01) |
| ***B65D 8/00*** | (2006.01) |

(56) References Cited

U.S. PATENT DOCUMENTS

| | | | |
|---|---|---|---|
| 2007/0044879 | A1 | 3/2007 | Watanabe et al. |
| 2012/0050448 | A1 | 3/2012 | Sakaino |

FOREIGN PATENT DOCUMENTS

| | | | |
|---|---|---|---|
| JP | 2005-342924 | A | 12/2005 |
| JP | 2007-167281 | A | 7/2007 |
| JP | 2007-210280 | A | 8/2007 |
| JP | 2007-319230 | A | 12/2007 |
| JP | 2010-188688 | A | 9/2010 |
| JP | 2010-201744 | A | 9/2010 |

* cited by examiner

PORTABLE PRINTER STORAGE CASE

TECHNICAL FIELD

The present invention relates to a portable printer storage case, for example, a storage case for protecting a portable printer from rain, dirt and dust, and so forth by storing therein the portable printer in use of the portable printer.

BACKGROUND

A portable printer is used in various fields including delivery of postal items, distribution of goods in parcel delivery services and so forth, and reading of electricity and gas meters. For example, in the parcel delivery services, when a recipient is absent, an absence notice is ejected by the portable printer while necessary information is printed thereon.

The portable printer is often used in external environment. Hence, the portable printer is stored in a storage case to be protected from rain, dirt and dust, and so forth, and is used while being attached to the belt of a user or being hung over the shoulder of the user. For example, Japan Laid-open Patent Application Publication No. 2007-167281 describes a storage case for a portable printer. This publication discloses a type of storage case including an opening. The opening is provided on the same side as the front side of the portable printer, i.e., the side on which an ejection port is provided, and exposes a front cover and the ejection port of the portable printer therethrough.

SUMMARY OF THE INVENTION

Technical Problem

Incidentally, when including a closable opening on the same side as the front side of the portable printer, the storage case is capable of ejecting printed labels through the ejection port provided on the front side of the portable printer or is capable of storing a continuous label stock in the portable printer, while the portable printer is stored therein. Hence in the storage case, good operability and good usability can be reliably achieved, while waterproofing and dust-proofing can be reliably achieved. However, chances are that after stored in the storage case, the portable printer stored therein inevitably drops from the front side of the storage case, which is the same side as the front side of the portable printer, if the front side of the storage case is not firmly closed or is forgotten to be closed.

The present invention has been produced in view of the aforementioned technical background, and is intended to provide a technology whereby a portable printer stored in a storage case can be prevented from dropping therefrom.

Solution to Problem

A storage case for a portable printer according to a first aspect of the present invention is characterized by including a case body, an opening and closing member and a holder. The case body is configured to store the portable printer and enables an ejection port surface of the portable printer to be exposed therethrough. The ejection port surface is provided with an ejection port to eject a print medium after printing of the print medium. The opening and closing member is mounted to the case body and is configured to be capable of opening and closing on a side of the ejection port surface. The holder holds the portable printer, is mounted to an interior of the case body, and is configured for covering part of the ejection port surface of the portable printer.

A storage case for a portable printer according to a second aspect of the present invention is characterized in that the holder is made of a harder material than the case body.

A storage case for a portable printer according to a third aspect of the present invention is characterized in that the holder is formed so as to cover a portion of the ejection port surface and a lateral surface of the portable printer.

A storage case for a portable printer according to a fourth aspect of the present invention is characterized in that the holder includes a first opening for replacing a battery of the portable printer therethrough.

A storage case for a portable printer according to a fifth aspect of the present invention is characterized in that the holder includes a second opening for connecting an interface connector to the portable printer therethrough.

A storage case for a portable printer according to a sixth aspect of the present invention is characterized in that the holder includes a pair of first protrusions protruding from respective sides of lateral surfaces of the portable printer along the ejection port surface side so as to cover part of the ejection port surface; the case body includes a pair of second protrusions protruding from respective sides of lateral surfaces of the portable printer along the ejection port surface side so as to cover the pair of first protrusions of the holder; and the opening and closing member and the pair of second protrusions are provided with surface fasteners on respective facing surfaces thereof, and the surface fasteners enable the opening and closing member and the pair of second protrusions to be attached to or detached from each other.

A storage case for a portable printer according to a seventh aspect of the present invention is characterized in that the opening and closing member includes a lower cover and an upper cover. The lower cover is configured to open and close at the lower side of the ejection port surface. The upper cover is configured to open and close at the upper side of the ejection port surface.

A storage case for a portable printer according to an eighth aspect of the present invention is characterized in that the lower cover is configured to be openable and closable in conjunction with an opening and closing motion of an opening and closing cover of the portable printer. The opening and closing cover is configured to open and close a supplying part provided for the print medium in an interior of the portable printer.

Advantageous Effects

In the storage case for a portable printer according to the aspect of the present invention, even if the opening and closing member of the storage case is not firmly closed or is forgotten to be closed, the portable printer stored in the storage case can be firmly held by the holder. Hence, the portable printer can be prevented from dropping from the storage case.

DESCRIPTION OF EMBODIMENTS

Figure 1:
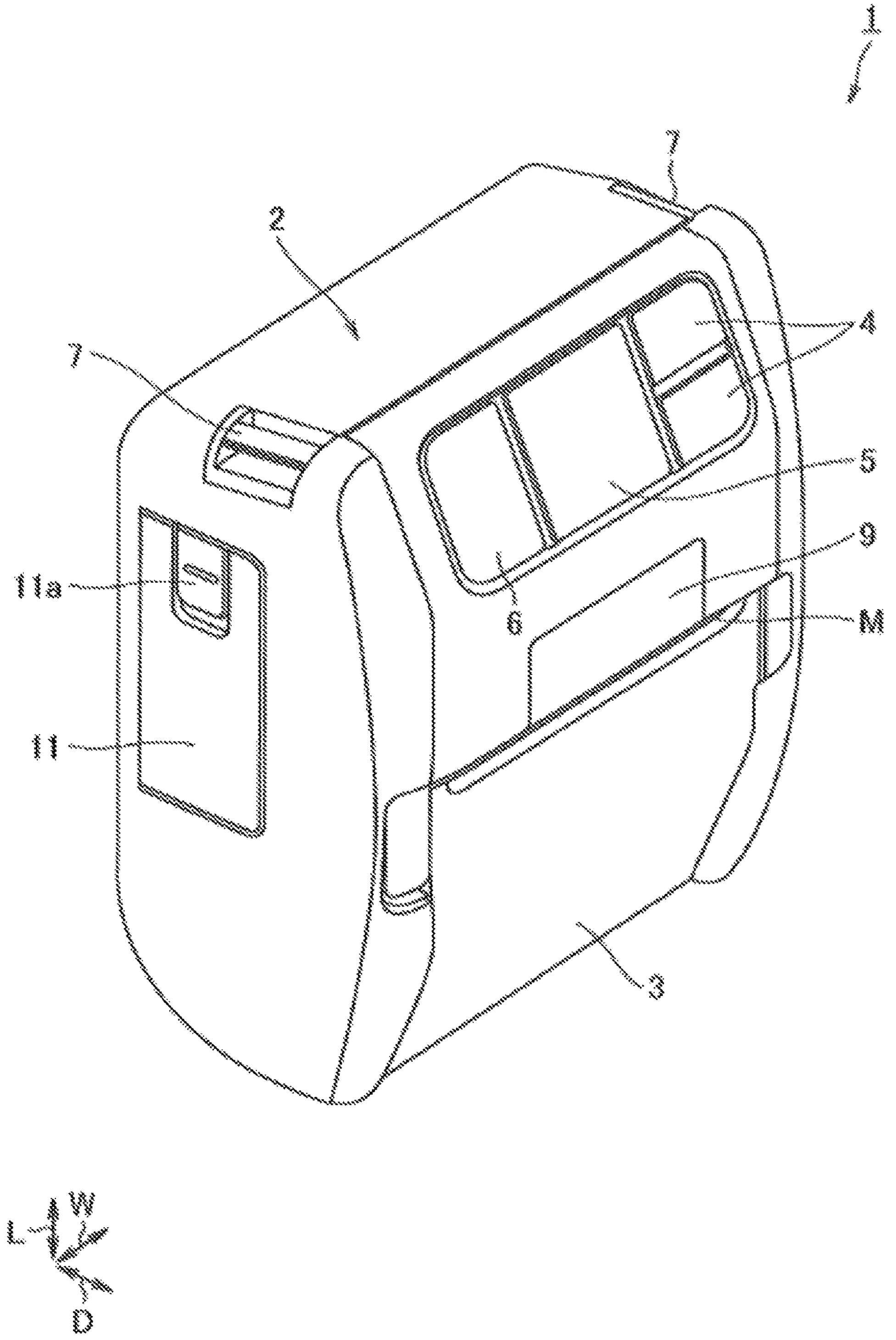
FIG. 1 is a perspective view of a portable printer configured to be stored in a storage case according to an exemplary embodiment of the present invention.

This application claims priority to Japanese Patent Application No. 2014-115350 filed on Jun. 4, 2014, the entirety of which is hereby incorporated by reference in its entirety.

Based on drawings, an exemplary embodiment will be hereinafter explained in detail as an example of the present invention. It should be noted that in principle, the same constituent elements will be denoted by the same reference sign in the drawings for explaining the exemplary embodiment, and will not be explained repeatedly.

(First Exemplary Embodiment)

Figure 2:
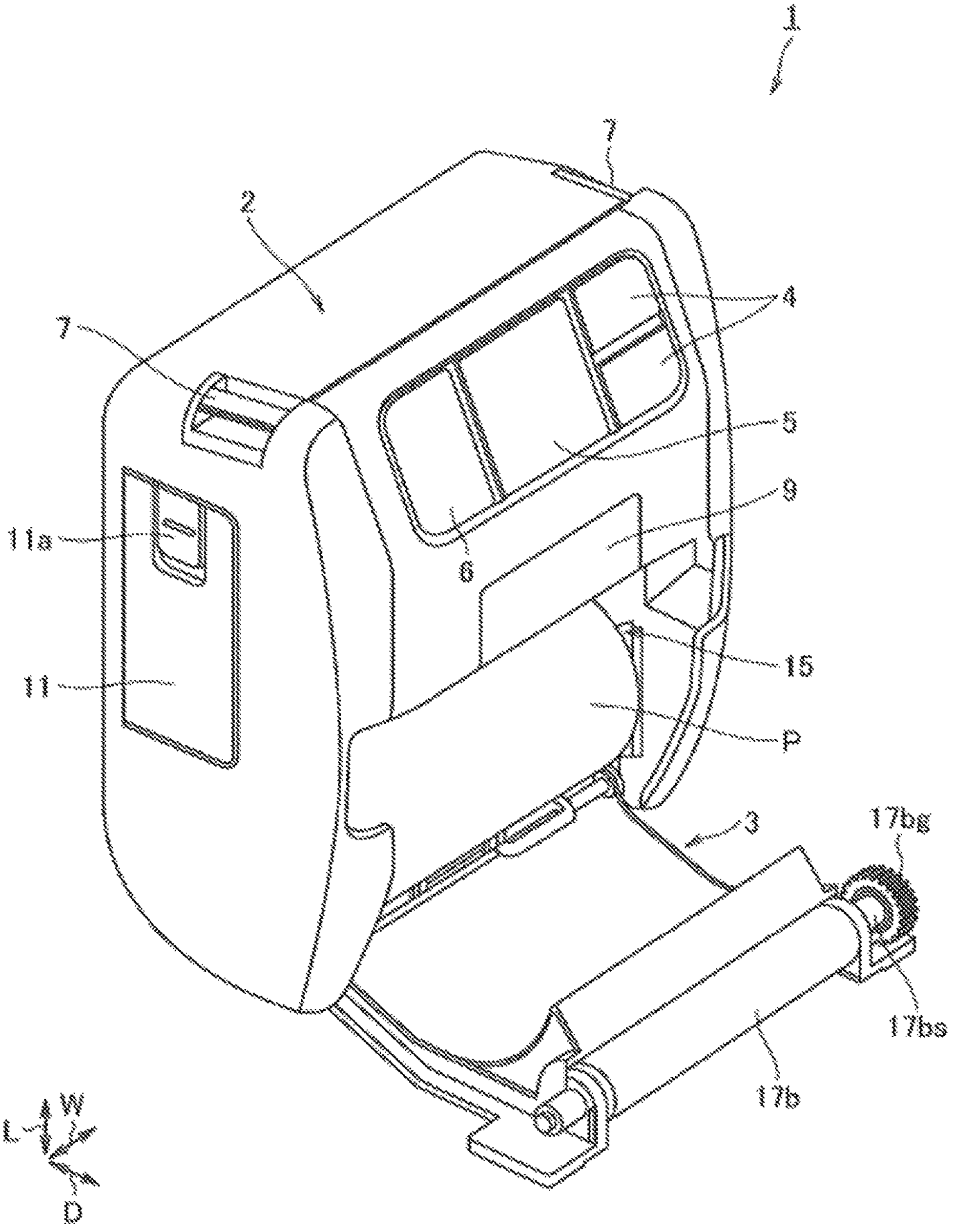
FIG. 2 is a perspective view of the portable printer shown in FIG. 1 in a condition that an opening and closing cover is opened.
Figure 3:
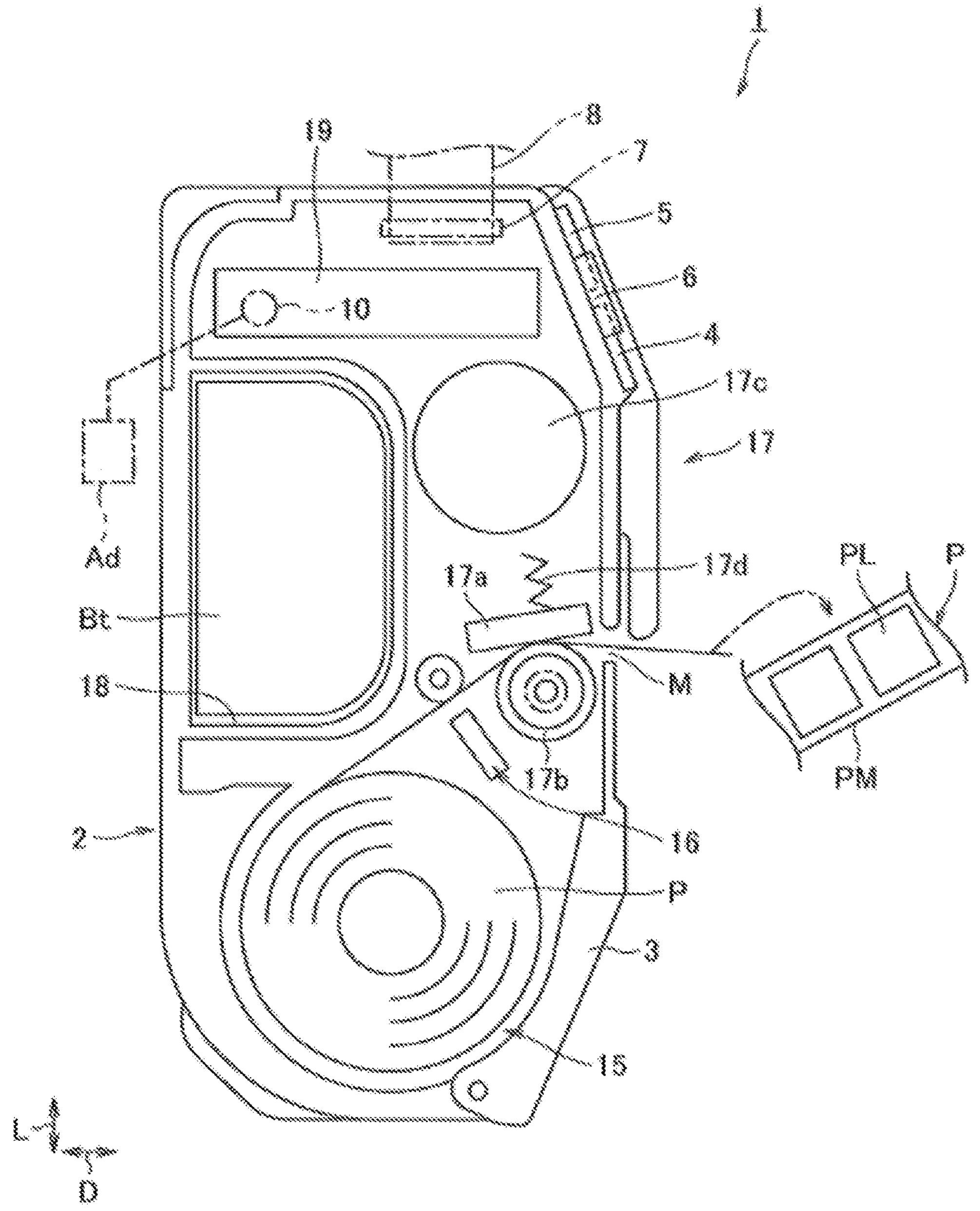
FIG. 3 is a diagram for explaining an internal structure of the portable printer shown in FIG. 1.

First, an exemplary portable printer configured to be stored in a storage case according to the present exemplary embodiment will be explained with reference to FIGS. 1 to 3. FIG. 1 is a perspective view of the portable printer. FIG. 2 is a perspective view of the portable printer shown in FIG. 1 in a condition that an opening and closing cover is opened. FIG. 3 is a diagram for explaining an internal construction of the portable printer shown in FIG. 1. It should be noted that in the drawings to be explained, arrow W indicates the width direction of the portable printer, arrow L indicates the lengthwise direction of the portable printer, and arrow D indicates the depth direction of the portable printer.

A portable printer 1 is made in a flat cuboid shape, for instance, and as shown in FIGS. 1 to 3, is attached in vertical orientation to the vicinity of the waist of a human body while being stored in a storage case to be described. Regarding the both end surfaces of the vertically oriented portable printer 1 in the depth direction D, one end surface in which an ejection port M (see FIGS. 1 and 3) is provided for ejecting a printed label will be referred to as a front surface (exemplary ejection port surface), whereas the other end surface on the opposite side of the one end surface will be referred to as a back surface. Additionally, regarding the both end surfaces of the portable printer 1 in the lengthwise direction L, one end surface on the upper side will be referred to as a top surface, whereas the other end surface on the opposite side of the one end surface will be referred to as a bottom surface. Moreover, the both end surfaces of the portable printer 1 in the width direction W will be referred to as lateral surfaces.

The portable printer 1 includes a housing 2 and an opening and closing cover 3. The housing 2 is a casing that forms the outer contour of the portable printer 1 and simultaneously forms a space for storing respective constituent elements. Operating parts 4, a display 5, an electric power button 6 and so forth are disposed in an upper region in the lengthwise direction L on the front surface of the housing 2 of the portable printer 1, while being sequentially aligned along the width direction W.

The operating parts 4 are buttons for inputting information and commands required for the portable printer 1. The display 5 is a screen for displaying commands, messages and so forth and is composed of, for instance, an LCD (Liquid Crystal Display). The electric power button 6 is a button for turning on and off an electric power supply of the portable printer 1.

The operating parts 4 and the display 5 are disposed in the upper region on the front surface of the printer 1 so as to be viewable from a worker. Additionally, the aforementioned region of the housing 2, in which the operating parts 4, the display 5, the electric power button 6 and so forth are disposed, slightly tilts whereby the worker can watch the operating parts 4, the display 5 and so forth when looking down. With this construction, the worker is capable of inputting information and commands into the portable printer 1 through the operating parts 4 while watching the display 5. It should be noted that unlike the operating parts 4 and the displays, the electric power button 6 is not required to be displayed in a position viewable from the worker, and hence, may be mounted on, for instance, the back surface or one of the lateral surfaces of the portable printer 1.

Additionally, the housing 2 of the portable printer 1 is provided with belt holders 7 on both end corners of the top surface in the width direction W. When a shoulder belt 8 (see FIG. 3) is hooked to the belt holders 7, the worker is capable of hanging the portable printer 1 from the shoulder even when the portable printer 1 is not stored in the storage case.

Additionally, the aforementioned opening and closing cover 3 is mounted to a lower region in the lengthwise direction L on the front surface of the portable printer 1, and is capable of taking an opened or closed position. In other words, the opening and closing cover 3 is mounted in a condition that its lower part in the lengthwise direction L is pivotably supported by the housing 2 through a hinge or so forth while its upper part in the lengthwise direction L (corresponding to approximately the middle of the portable printer 1 in the lengthwise direction L) is movable in directions separating from and approaching to the housing 2 about the pivotably supported lower part as a fulcrum. A cover open button 9 is disposed on approximately the middle of the front surface of the portable printer 1 in the lengthwise direction L. When the cover open button 9 is pressed, the opening and closing cover 3 is configured to be opened. Here, the upper part of the opening and closing cover 3 is configured to be opened downward. A gap between the housing 2 and the upper part of the opening and closing cover 3 is formed as the ejection port M for the aforementioned labels.

Additionally, an adapter connection terminal 10 (see FIG. 3) is mounted to an upper region in the lengthwise direction L on one lateral surface of the portable printer 1. The adapter connection terminal 10 is a terminal provided for connecting thereto an AC (Alternating Current) adapter Ad (interface connector) for electric charging in charging a battery Bt of the portable printer 1.

Additionally, a battery cover 11 (see FIGS. 1 and 2) is mounted to an upper region in the lengthwise direction L on the other lateral surface of the portable printer 1, while flushing with the surface of the housing 2. The battery cover 11 is configured to be opened when a slide-type lock lever 11*a* of the battery cover 11 is slid by an operation of the worker.

As shown in FIG. 3, a label supplying part 15, a label location detection sensor 16, a printing part 17, a battery housing 18, a controller 19 and so forth are installed in the interior of the housing 2 of the portable printer 1 constructed as described above.

The label supplying part 15 is disposed in a lower region in the lengthwise direction L in the interior of the portable printer 1. The label supplying part 15 is a compartment for storing a rolled continuous label stock P in a rotatable state. When the aforementioned opening and closing cover 3 is opened, the rolled continuous label stock P can be stored in the label supplying part 15 of the portable printer 1.

The continuous label stock P includes, for instance, a long strip of a paper mount PM and a plurality of labels PL temporarily attached to the paper mount PM at predetermined intervals along the lengthwise direction of the paper mount PM. The labels PL are so-called thermal labels. A thermosensitive color former layer is disposed on the front surface (printing surface) of each label PL, and is configured to turn a predetermined color (black, red, etc.) when reaching a predetermined temperature range. Additionally, in order to indicate the locations of the labels PL, location detection marks (not shown in the drawings) are provided on the back side of the label attached surface of the paper mount PM while being aligned at predetermined intervals along the lengthwise direction of the paper mount PM.

The label location detection sensor 16 is a sensor for detecting the locations of the labels PL on the continuous label stock P (i.e., location detection marks on the aforementioned paper mount PM, regions between adjacent labels PL on the paper mount PM, etc.). The label location detection sensor 16 is composed of a reflective photosensor, a transmissive photosensor or so forth. When the label location detection sensor 16 is a reflective photosensor, a light emitter and a light receiver of the label location detection sensor 16 are disposed to face the back surface of the paper mount PM in a feeding path of the continuous label stock P released in a sheet shape from the label supplying part 15. By contrast, when the label location detection sensor 16 is a transmissive photosensor, the light emitter and the light receiver of the label location detection sensor 16 are disposed while interposing therebetween the continuous label stock P released in a sheet shape from the label supplying part 15.

The printing part 17 is a functional unit configured to print the labels PL of the continuous label stock P. As shown in FIG. 2, the printing part 17 includes a thermal head 17*a*, a platen roller 17*b*, a motor 17*c* and a spring member 17*d*.

The thermal head 17*a* is printing means for printing information, for instance, a character, a sign, a diagram, a bar code or so forth on each label PL. The thermal head 17*a* is mounted such that its printing surface faces a paper path when the opening and closing cover 3 is set in the closed state. A plurality of heating resistors (heating elements), configured to generate heat by electric conduction, are mounted to the print surface of the thermal head 17*a* while being aligned along the width direction of the continuous label stock P. In a printing process (when the opening and closing cover 3 is set in the closed state), the thermal head 17*a* is configured to be urged toward the platen roller 17*b* through the continuous label stock P by the spring member 17*d*.

The platen roller 17*b* is feeding means for feeding the continuous label stock P, and is rotatably supported by the upper part of the opening and closing cover 3 while being rotatable in normal and reverse directions. As shown in FIG. 3, the platen roller 17*b* is configured to face the thermal head 17*a* when the opening and closing cover 3 is set in the closed state. As shown in FIG. 2, a gear 17*bg* is connected to one end of a platen roller shaft 17*bs* of the platen roller 17*b*. When the opening and closing cover 3 is set in the closed state, the gear 17*bg* is configured to be engaged with a gear and so forth (not shown in the drawings) mounted to the interior of the housing 2 and be mechanically connected to the motor 17*c* through the gear and so forth.

The motor 17*c* is a drive source configured to rotate the platen roller 17*b* in the normal and reverse directions. For example, a stepping motor (not shown in the drawings) is used as the motor 17*c*. The spring member 17*d* is a member configured to urge the thermal head 17*a* toward the platen roller 10, and is disposed on the back side of the thermal head 17*a*.

The battery housing 18 is a compartment for storing the aforementioned battery Bt. When the aforementioned battery cover 11 is opened, the battery Bt can be inserted into and removed from the battery housing 18. The battery Bt is a rechargeable battery for supplying electric power to the entirety of the portable printer 1. For example, a lithium-ion battery is used as the battery Bt.

The controller 19 is a circuit unit for controlling the entire action of the portable printer 1. The controller 19 is electrically connected to the operating parts 4, the display 5, the electric power button 6, the adapter connection terminal 10, the label location detection sensor 16, the thermal head 17*a*, the motor 17*c*, the battery Bt and so forth.

In the printing process of the portable printer 1 constructed as described above, the continuous label stock P is configured to be fed toward the printing part 17 by rotating the platen roller 17*b* while one lengthwise end of the continuous label stock P released in a sheet shape from the label supplying part 15 is pinched between the thermal head 17*a* and the platen roller 17*b*. At this time, the heat resistors of the thermal head 17*a* are selectively caused to generate heat in response to a print signal transmitted to the thermal head 17*a* from the controller 19, and thus, intended information is configured to be printed on the labels PL of the continuous label stock P at printing timing set based on the information detected by the label locating detecting sensor 16. Then, the printed continuous label stock P is configured to be ejected from the ejection port M.

Next, an exemplary storage case for storing the portable printer 1 according to the present exemplary embodiment will be explained with reference to FIGS. 4 to 18.

Figure 4:
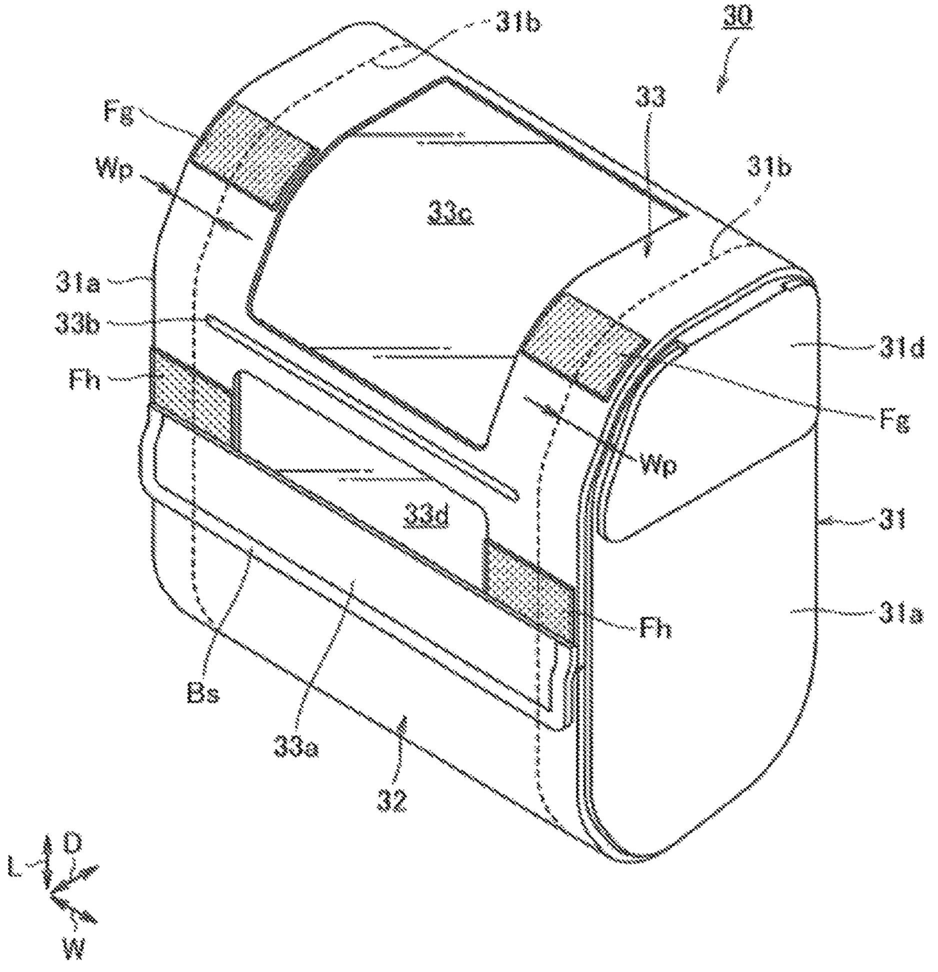
FIG. 4 is a perspective view of a storage case.
Figure 5:
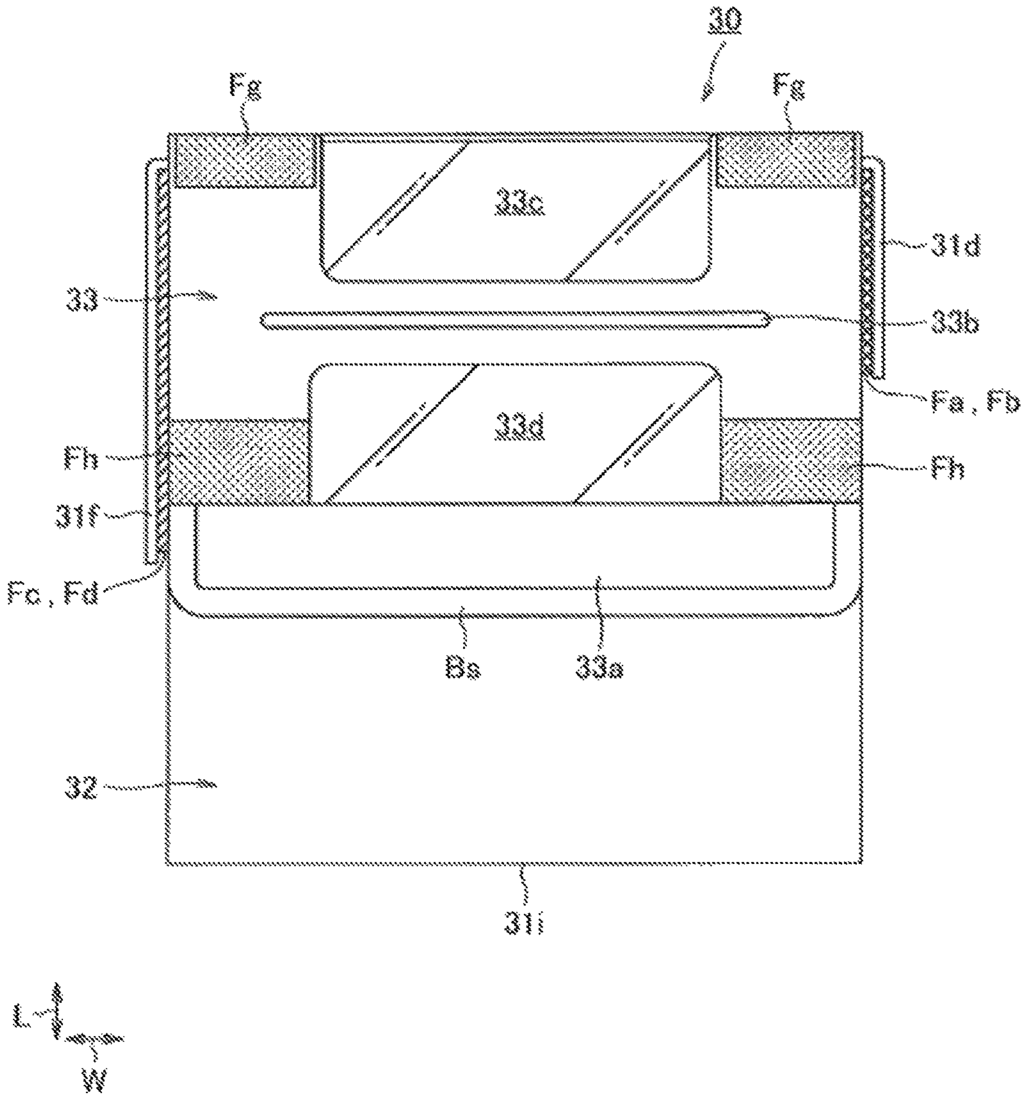
FIG. 5 is a front view of the storage case shown in FIG. 4.
Figure 6:
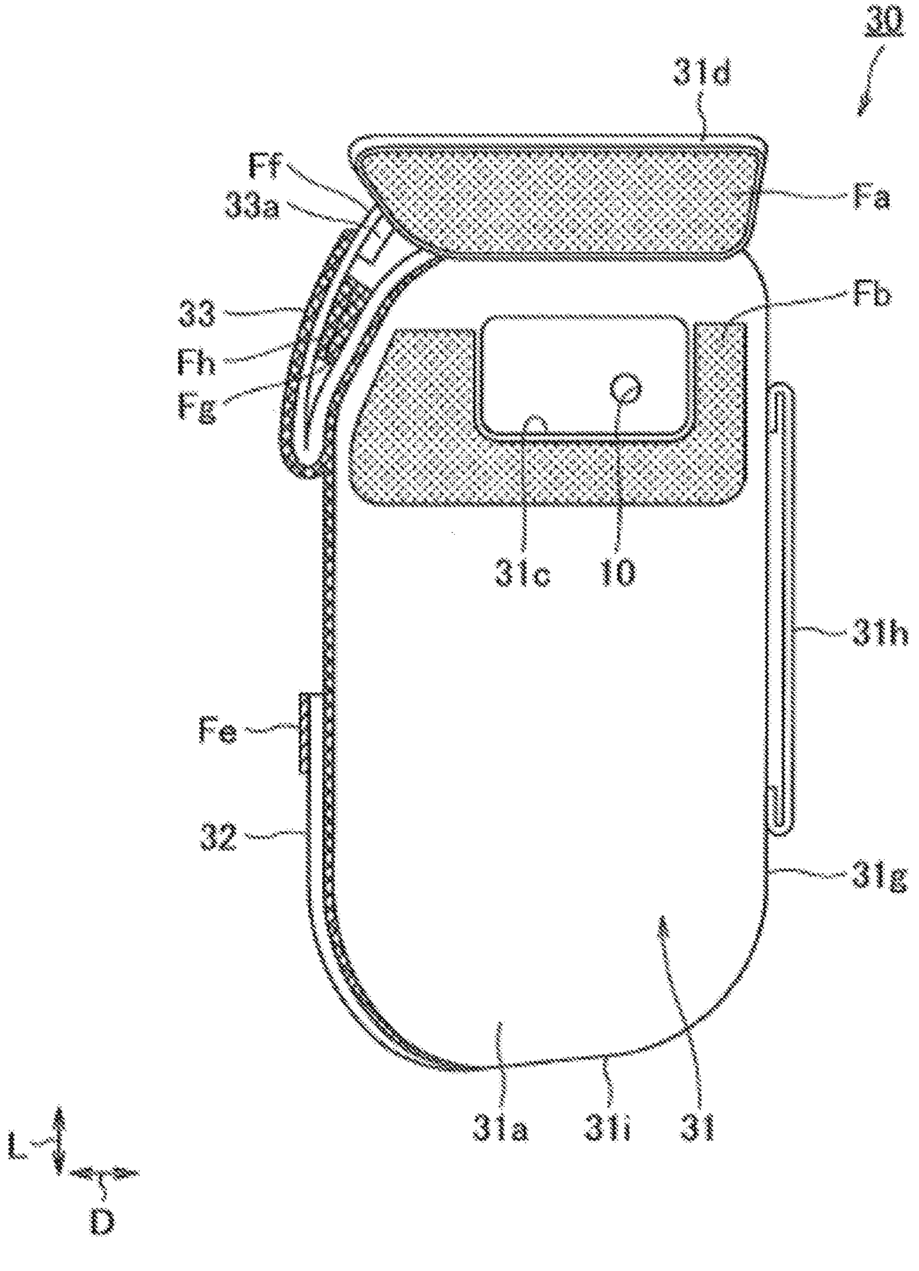
FIG. 6 is a right side view of the storage case shown in FIG. 4 and shows a condition that an upper cover is opened.
Figure 7:
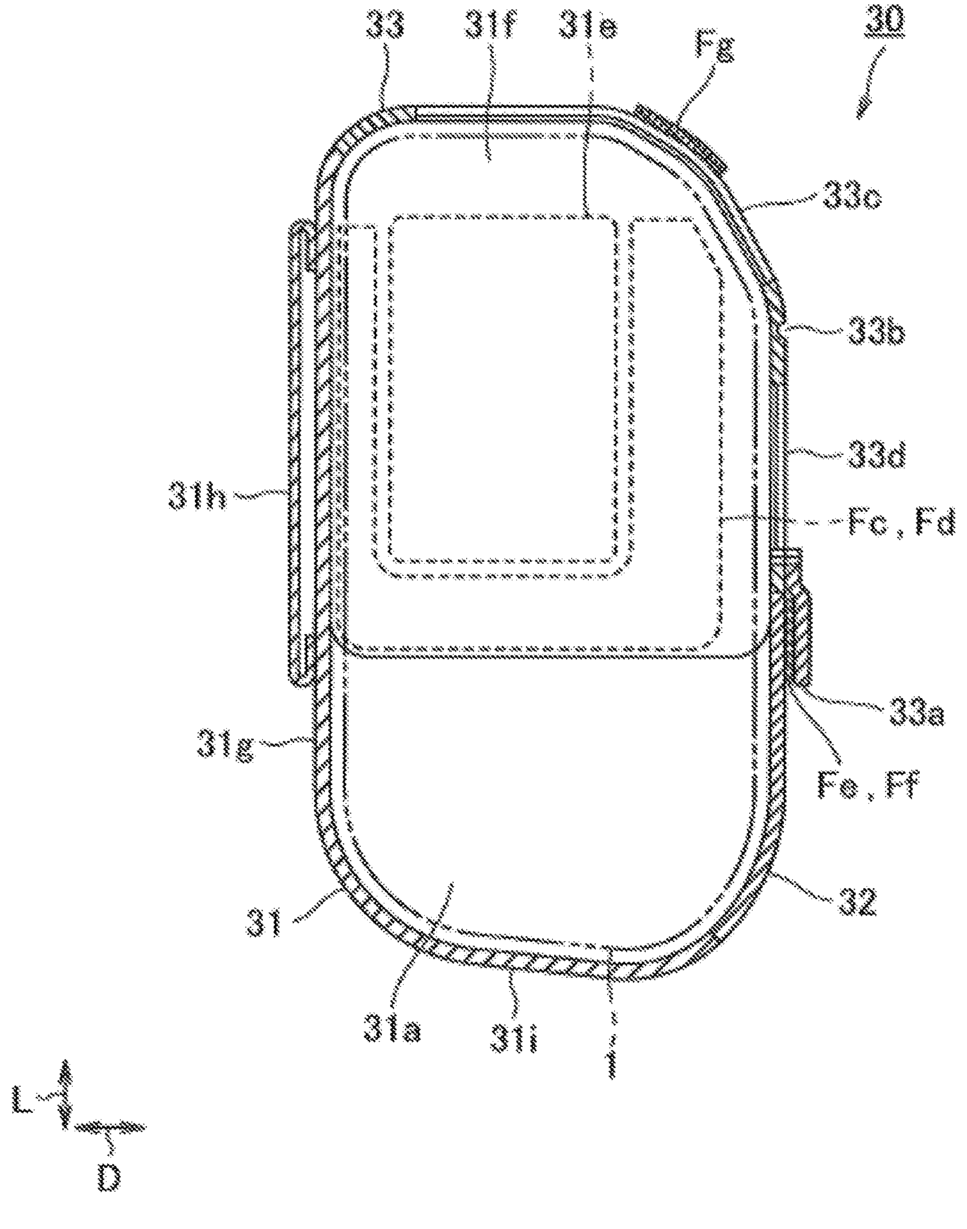
FIG. 7 is a left side view of the storage case shown in FIG. 4.
Figure 8:
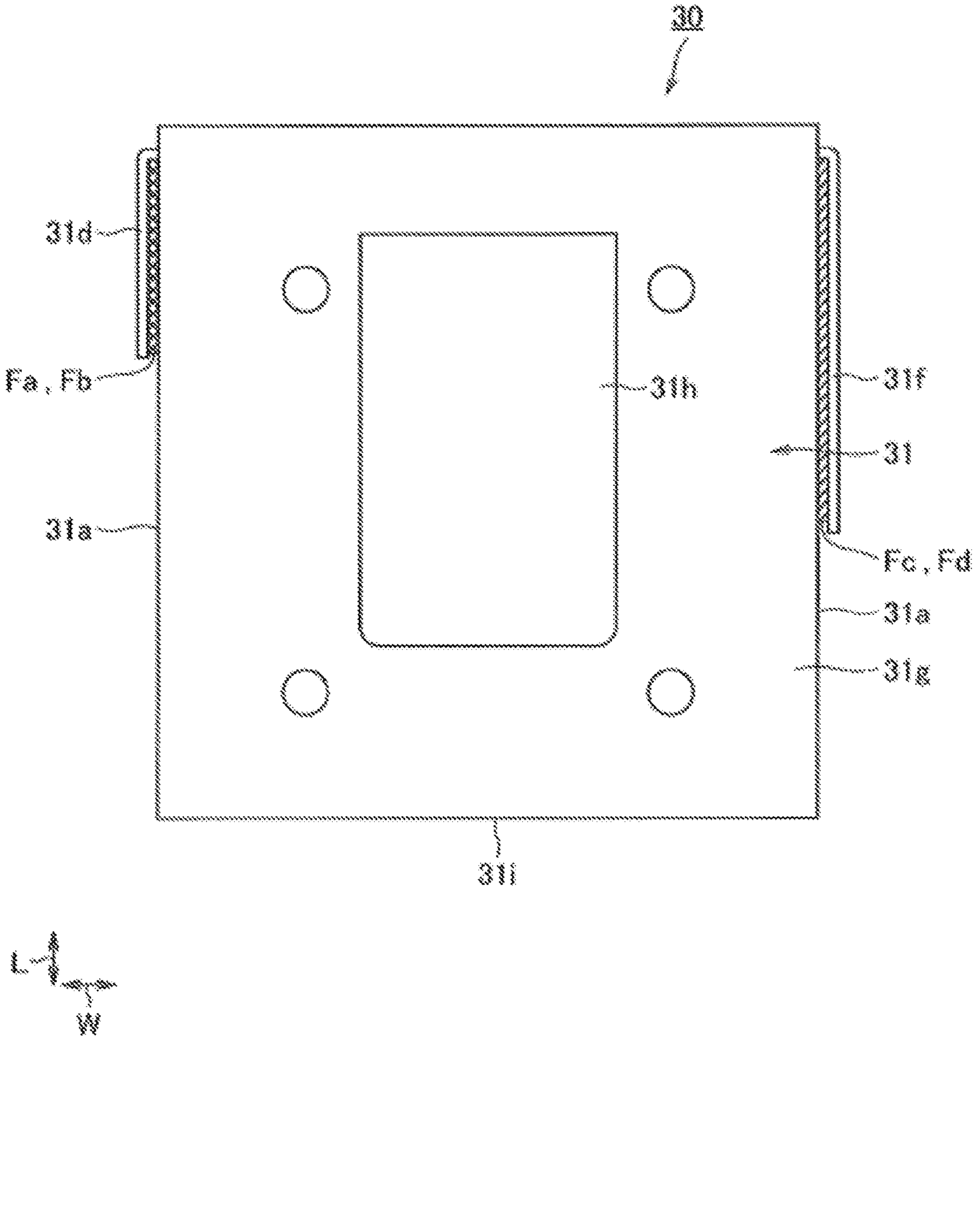
FIG. 8 is a rear view of the storage case shown in FIG. 4.

First, FIG. 4 is a perspective view of the storage case. FIG. 5 is a front view of the storage case shown in FIG. 4. FIG. 6 is a right side view of the storage case shown in FIG. 4 and shows a condition that an upper cover is opened. FIG. 7 is a left side view of the storage case shown in FIG. 4. FIG. 8 is a rear view of the storage case shown in FIG. 4.

A storage case 30 is a container for storing the aforementioned portable printer 1. The storage case 30 includes a case body 31, a lower cover 32 and an upper cover 33, which are integrated to each other. It should be noted that a front surface of the storage case 30 refers to a surface located on the same side as the front surface of the portable printer 1, whereas a back surface of the storage case 30 refers to a surface located on the opposite side of the front surface thereof. Additionally, a top surface of the storage case 30 refers to a surface located on the same side as the top surface of the portable printer 1, whereas a bottom surface of the storage case 30 refers to a surface located on the opposite side of the top surface thereof. Moreover, lateral surfaces of the storage case 30 refer to surfaces located on the same sides as the lateral surfaces of the portable printer 1.

For example, the material, of which the case body 31, the lower cover 32 and the upper cover 33 of the storage case 30 are made, is one of the group consisting of leather and its related material (including artificial leather such as PU), vinyl material (exemplary resin sheet) and synthetic fiber, or is alternatively a laminated sheet obtained by laminating these materials. Additionally, the material of which the case body 31, the lower cover 32 and the upper cover 33 are made is required to be waterproof, and hence, preferably has water repellent properties.

The case body 31 is shaped to cover apart of the front surface, the back surface, the both lateral surfaces and the bottom surface of the portable printer 1. Case lateral surfaces 31*a* of the case body 31 are constituent parts composing the both lateral surfaces of the case body 31 (i.e., parts covering the both lateral surfaces of the portable printer 1). As shown in FIG. 4, a pair of protrusions 31*b* (exemplary second protrusions) are integrally connected to the outer peripheral parts of the case lateral surfaces 31*a*, and thus protrude to the front side and the top side of the storage case 30. The front surface and the top surface of the portable printer 1 are partially covered with the pair of the protrusions 31*b* in the vicinity of the lateral surfaces of the portable printer 1.

Additionally, as shown in FIG. 6, one of the case lateral surfaces 31*a* of the case body 31 is provided with a hole portion 31*c* in a corresponding position to the adapter connection terminal 10 of the portable printer 1 stored in the storage case 30. The hole portion 31*c* is an opening for exposing the adapter connection terminal 10 of the portable printer 1 stored in the storage case 30 to the outside of the storage case 30. The hole portion 31*c* has, for instance, an approximately rectangular shape in a plan view.

Additionally, a side cover 31*d* is mounted to an upper region of the one case lateral surface 31*a* so as to cover the hole portion 31*c*. The side cover 31*d* has the same shape as the upper region of the one case lateral surface 31*a* in a plan view. The side cover 31*d* is mounted thereto while its tip end is movable in directions separating from and approaching to the case body 31, and is capable of taking an opened or closed position.

Additionally, a surface fastener Fa is mounted to the back surface of the side cover 31*d* (surface facing the one case lateral surface 31*a*), whereas a surface fastener Fb is mounted to a part of the one case lateral surface 31*a* so as to face the back surface of the side cover 31*d*. With this construction, the side cover 31*d* is configured to be detachably attached to the one case lateral surface 31*a* while being tightly contactable therewith. When the side cover 31*d* is closed to close the hole portion 31*c*, the interior of the storage case 30 can be kept sealed. On the other hand, when the side cover 31*d* is opened, the AC adapter Ad can be electrically connected to the adapter connection terminal 10 of the portable printer 1 from the outside of the storage case 30 while the portable printer 1 is stored in the storage case 30, and the battery Bt can be thereby charged.

The aforementioned surface fasteners are referred to as, in general, "Magic Tape" (Japanese registered trademark for a hook-and-loop fastener) and are composed of woven hooks densely woven in a hook shape and woven loops densely woven in a loop shape. The woven hooks and the woven loops are capable of being stuck to each other when pressed against each other. The woven hooks and the woven loops are also capable of being peeled off from each other when forces are applied thereto in opposite directions so as to separate them from each other. Regarding the surface fasteners in the present exemplary embodiment, for instance, the woven loops are provided on one of facing surfaces whereas the woven hooks are provided on the other of the facing surfaces. It should be noted that the surface fasteners are not limited to a type that a loop surface provided with only woven loops and a hook surface provided with only woven hooks are provided as discrete surfaces. Alternatively, the surface fasteners may employ a type that the loop surface and the hook surface are not discrete surfaces. In other words, each of the facing surfaces may be provided with both of the woven loops and the woven hooks. In this type, it is possible to prevent a situation that the hook surface and the loop surface are attached the wrong way round in fabricating the storage case 30. It should be noted that in the drawings to be described, the surface fasteners are hatched for easy recognition in the drawings.

Additionally, as shown in FIG. 7, the other of the case lateral surfaces 31*a* of the case body 31 is provided with a hole portion 31*e* in a corresponding position to the battery cover 11 of the portable printer 1 stored in the storage case 30. The hole portion 31*e* is an opening for exposing the battery cover 11 of the portable printer 1 stored in the storage case 30 to the outside of the storage case 30. The hole portion 31*e* has, for instance, an approximately rectangular shape in a plan view.

Additionally, a side cover 31*f* is mounted to an upper region of the other case lateral surface 31*a* so as to cover the hole portion 31*e*. The side cover 31*f* has the same shape as the upper region of the other case lateral surface 31*a* in a plan view. The side cover 31*f* is mounted thereto while its tip end is movable in directions separating from and approaching to the case body 31, and is capable of taking an opened or closed position.

Additionally, similarly to the surface fasteners Fa and Fb shown in FIG. 6, a surface fastener Fc is mounted to the back surface of the side cover 31*f* (surface facing the other case lateral surface 31*a*), whereas a surface fastener Fd is mounted to a planar part of the other case lateral surface 31*a* so as to face the back surface of the side cover 31*f* (see FIGS. 7 and 8). With this construction, the side cover 31*f* is configured to be detachably attached to the other case lateral surface 31*a* while being tightly contactable therewith. When the side cover 31*f* is closed to close the hole portion 31*e*, the interior of the storage case 30 can be kept sealed. On the other hand, when the side cover 31*f* is opened, the battery Bt of the portable printer 1 can be replaced from the outside of the storage case 30 while the portable printer 1 is stored in the storage case 30.

Incidentally, as shown in FIGS. 6 to 8, a back surface 31*g* of the case body 31 is a part composing the back surface of the case body 31 (a part covering the back surface of the portable printer 1). The back surface 31*g* is provided with a belt holder 31*h*. When a belt of the worker is inserted through the belt holder 31*h*, the portable printer 1 is configured to be attachable to the vicinity of the waist of the worker while being stored in the storage case 30. It should be noted that means for holding the portable printer 1 is not limited to the belt holder 31*h*, and can be variously changed. For example, the case body 31 may be provided with a plate hook on its back surface, and the plate hook may be hooked on the belt of the worker. Alternatively, the shoulder belt 8 may be hung over the shoulder of the worker while being hooked to the belt holders 7 of the portable printer 1.

On the other hand, a bottom surface 31*i* of the case body 31 is a part composing the bottom surface of the case body 31 (a part covering the bottom surface of the portable printer 1). The lower cover 32 is integrally connected to the bottom surface 31*i*. The lower cover 32 is a part composing a lower region of the front surface of the storage case 30. The lower cover 32 is shaped to cover a range from a lower region of the front surface of the portable printer 1 to an approximately middle position in the lengthwise direction L, while being bridged between the aforementioned pair of the protrusions 31*b* on the lower region of the front surface of the storage case 30. In other words, the lower cover 32 extends from the lower region of the front surface of the case body 31 so as to cover the opening and closing cover 3 of the portable printer 1, and ends below the ejection port M so as not to cover the ejection port M of the portable printer 1. In the lower cover 32, a tip end refers to an extending-side end that is configured to be located closely to the ejection port M of the portable printer 1 when the lower cover 32 is closed. Additionally, in the lower cover 32, an external surface refers to a surface that is configured to be viewable when the lower cover 32 is closed, whereas a back surface refers to a surface that is located on the back side of the external surface and is configured to face the front surface of the portable printer 1 when the lower cover 32 is closed.

Moreover, the lower cover 32 is integrated with the case body 31 such that its tip end is movable in directions separating from and approaching to the case body 31, and is capable of taking an opened or closed position. Therefore, when the lower cover 32 of the storage case 30 is opened downward relatively to the case body 31, the opening and closing cover 3 of the portable printer 1 can opened while the portable printer 1 is stored in the storage case 30, and the rolled continuous label stock P can be then stored in the label supplying part 15 of the portable printer 1.

Additionally, the lower cover 32 is provided with a surface fastener Fe (see FIGS. 6 and 7) on the tip end of its external surface. The surface fastener Fe extends in a band-like shape along the edge of the tip end of the lower cover 32.

The upper cover 33 is a part composing the top surface and an upper region of the front surface of the storage case 30. The upper cover 33 is shaped to cover the entire top surface of the portable printer 1 and a range from the upper region of the front surface of the portable printer 1 to the approximately middle position in the lengthwise direction L, while being bridged between the aforementioned pair of the protrusions 31*b* on the upper region of the front surface of the storage case 30. In other words, the upper cover 33 is shaped to extend from an upper region of the back surface of the case body 31 to a position enough to cover the ejection port M of the portable printer 1 via the top surface of the portable printer 1 such that its extending-side end ends to overlap on the tip end of the lower cover 32 set in the closed state. In the upper cover 33, a tip end refers to an extending-side end that is configured to be located closely to the ejection port M of the portable printer 1 when the upper cover 33 is closed. Additionally, in the upper cover 33, an external surface refers to a surface that is configured to be viewable when the lower cover 33 is closed, whereas a back surface refers to a surface that is located on the back side of the external surface and is configured to face the front surface of the portable printer 1 when the lower cover 33 is closed.

Moreover, the upper cover 33 is integrated with the case body 31 such that its tip end is movable in directions separating from and approaching to the case body 31, and is capable of taking an opened or closed position. Therefore, when the tip end of the upper cover 33 of the storage case 30 is opened upward relatively to the case body 31, the portable printer 1 can be stored in the storage case 30.

Furthermore, a flap plate 33*a* having a band-like shape is adhered to the tip end of the upper cover 33 by adhesive or so forth while extending along the edge of the tip end of the upper cover 33. The flap plate 33*a* is adhered to the external surface of the upper cover 33 while slightly protruding outside the storage case 30. The back surface (a surface facing the front surface of the portable printer 1) of the flap plate 33*a* is shifted beyond the back surface of the upper cover 33 to the outside of the storage case 30. The flap plate 33*a* is provided with a surface fastener Ff (see FIGS. 6 and 7) on its back surface. The fastener surface position of the surface fastener Ff is shifted beyond the back surface of the upper cover 33 to the outside of the storage case 30 by the thickness of the lower cover 32.

When being set in the closed state, the lower cover 32 and the upper cover 33 are stuck tightly in contact with each other by overlapping the surface fastener Ff mounted to the back surface of the flap plate 33*a* provided on the tip end of the upper cover 33 on the surface fastener Fe mounted to the tip end of the external surface of the lower cover 32. When the tip end of the upper cover 33 is herein directly overlapped on the tip end of the lower cover 32 without providing the tip end of the upper cover 33 with the flap plate 33*a*, a part of the upper cover 33 in the vicinity of the overlapped part is likely to flip up. This could result in degradation of contact tightness between the lower cover 32 and the upper cover 33.

By contrast, the flap plate 33*a* is herein provided on the lower part of the upper cover 33 as described above. Hence, when the upper cover 33 is closed, the surface fastener Ff mounted to the back surface of the flap plate 33*a* provided on the tip end of the upper cover 33 and the surface fastener Fe mounted to the tip end of the external surface of the lower cover 32 can be stuck to each other while the tip end of the upper cover 33 and that of the lower cover 32 are abutted to each other (see FIGS. 4 and 7). Therefore, the tip end of the upper cover 33 can be prevented from flipping up. As a result, it is possible to enhance contact tightness in the stuck part between the lower cover 32 and the upper cover 33.

Additionally, the outer peripheral part of the flap plate 33*a* is covered with a bias tape Bs (see FIGS. 4 and 5). When the bias tape Bs is not provided, there is a possibility of damaging the clothes of the worker. For example, the clothes of the worker make contact with the surface fastener Ff and form lint. Especially, the surface fastener Ff of the upper cover 33 is likely to make contact with the clothes of the worker when the upper cover 33 is upwardly opened for storing the portable printer 1 in the storage case 30. Hence, the clothes of the worker are likely to be damaged. Additionally, as described below, similarly in a printing process of the portable printer stored in the storage case 30 (see FIG. 22), the upper cover 33 is kept opened upward, and the worker often attaches the portable printer 1 in this condition to the vicinity of the waist. Hence, the surface fastener Ff of the upper cover 33 is likely to make contact with and damage the clothes of the worker. By contrast, in the present exemplary embodiment, the outer peripheral part of the flap plate 33*a* is covered with the bias tape Bs. Hence, the surface fastener Ff can be inhibited or prevented from making contact with the clothes of the worker. Consequently, the clothes of the worker can be inhibited or prevented from being damaged by the surface fastener Ff. Obviously, the bias tape Bs can also prevent the outer peripheral part of the surface fastener Ff from raveling (degrading).

Additionally, the upper cover 33 is provided with a bent groove 33*b* (see FIGS. 4, 5 and 7) on its external surface. The bent groove 33*b* is located in an intermediate position of the upper cover 33 extending from the upper region of the back surface to the front surface of the storage case 30. For example, the bent groove 33*b* is baked by thermal stamping and extends in an approximately straight shape along the width direction W of the upper cover 33. The tip end-side part of the upper cover 33 is upwardly bendable along the bent groove 33*b*.

The bent groove 33*b* baked by thermal stamping is likely to be shallow due to resilience of the material of the upper cover 33. Besides, even when being bent along the bent groove 33*b*, the upper cover 33 exhibits properties of returning to a straight position due to elasticity of non-grooved parts on respective sides of the bent groove 33*b* in the lengthwise direction of the bent groove 33*b*. The force of returning to the straight position is weakened by repeatedly bending the upper cover 33 so as to form a crease. Hence, the position of the upper cover 33 can be kept at various bent angles. By thus keeping the upper cover 33 at various bent angles, the upper cover 33 can form an eave above the ejection port M of the portable printer 1.

Additionally, the upper cover 33 is provided with surface fasteners Fg and surface fasteners Fh (see FIGS. 4 and 5) on its external surface. The surface fasteners Fg are provided on a bending region as a boundary between the top surface and the front surface of the storage case 30, whereas the surface fasteners Fh are provided in the vicinity of the flap plate 33*a* provided on the tip end of the upper cover 33. With this construction, when the tip end-side part of the upper cover 33 is upwardly bent along the bent groove 33*b* to press the surface fasteners Fh provided on the tip end-side part of the upper cover 33 onto the surface fasteners Fg provided on the boundary between the top surface and the front surface of the upper cover 33, the tip end of the upper cover 33 can be stuck to the upper part of the upper cover 33 and thus the upper cover 33 can be held in an upwardly folded state. It should be noted that contact tightness is not particularly required in the folded part of the upper cover 33. Hence, means for holding the upper cover 33 is not limited to the use of surface fasteners and can be variously changed. For example, male and female buttons configured to be fitted to each other may be employed as the means for holding the upper cover 33.

Moreover, the upper cover 33 is provided with a first transparent window 33*c* and a second transparent window 33*d*. The first transparent window 33*c* is disposed above the bent groove 33*b*, whereas the second transparent window 33*d* is disposed below the bent groove 33*b* (on the tip end-side part of the upper cover 33). The first and second transparent windows 33*c* and 33*d* are windows for making viewable the operating parts 4, the display 5 and so forth of the portable printer 1 stored in the storage case 30 while the upper cover 33 is closed.

The first and second transparent windows 33*c* and 33*d* are made of, for instance, flexible transparent resin. This enables the worker to watch the operating parts 4, the display 5 and so forth and to accurately operate the portable printer 1, even when the first and second transparent windows 33*c* and 33*d* are overlapped in a double glazing state.

The relative positional relation, the window areas and so forth of the first and second transparent windows 33*c* and 33*d* are set to make viewable the operating parts 4, the display 5 and the electric power button 6 disposed on the upper region of the front surface of the portable printer 1 when the upper cover 33 is folded along the bent groove 33*b* to overlap the first and second transparent windows 33*c* and 33*d*.

In the present exemplary embodiment, the first transparent window 33*c* is provided over a region ranging from the vicinity of the upper region of the back surface of the case body 31 to the vicinity of the bent groove 33*b* of the upper cover 33 via the top surface of the case body 31, and the window area of the first transparent window 33*c* is larger than that of the second transparent window 33*d*. With this construction, the operating parts 4 and so forth of the portable printer 1 are operable even when the portable printer 1 is largely covered with the storage case 30.

It should be noted that the relative positional relation, the window areas and so forth of the first and second transparent windows 33*c* and 33*d* depend on factors such as the positional arrangement of the operating parts 4 and the display 5 of the portable printer 1, and hence, are not limited to those described above and can be variously changed. For example, the window area of the first transparent window 33*c* and that of the second transparent window 33*d* may be set to be equal. It should be noted that the term "transparent" herein refers to a state that a constituent element behind a transparent member is visible in, for instance, operating the constituent element. The term "transparent resin" encompasses not only uncolored resin but also colored translucent resin and uncolored translucent resin.

Figure 9:
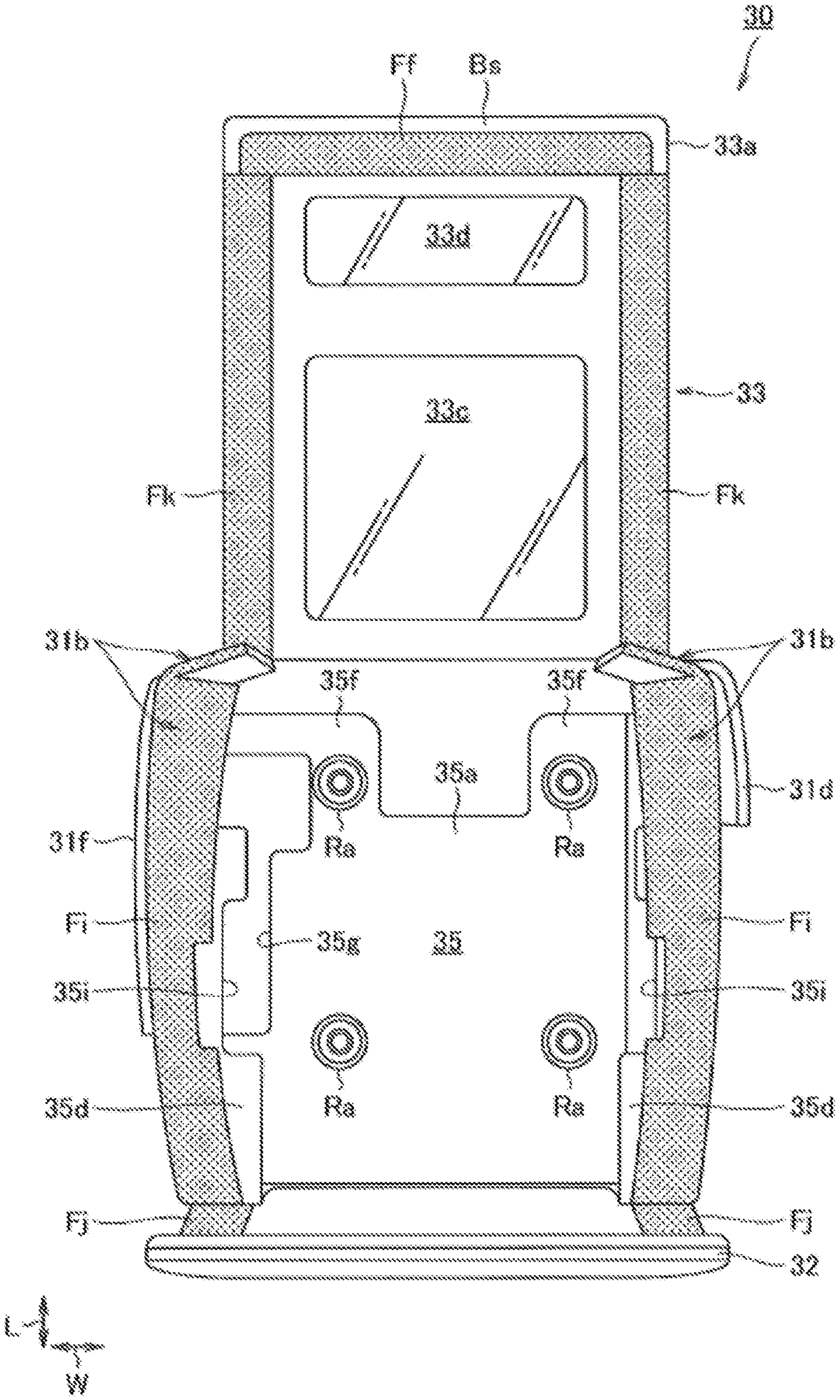
FIG. 9 is a perspective view of the storage case in a condition that the upper cover and a lower cover are opened.
Figure 10:
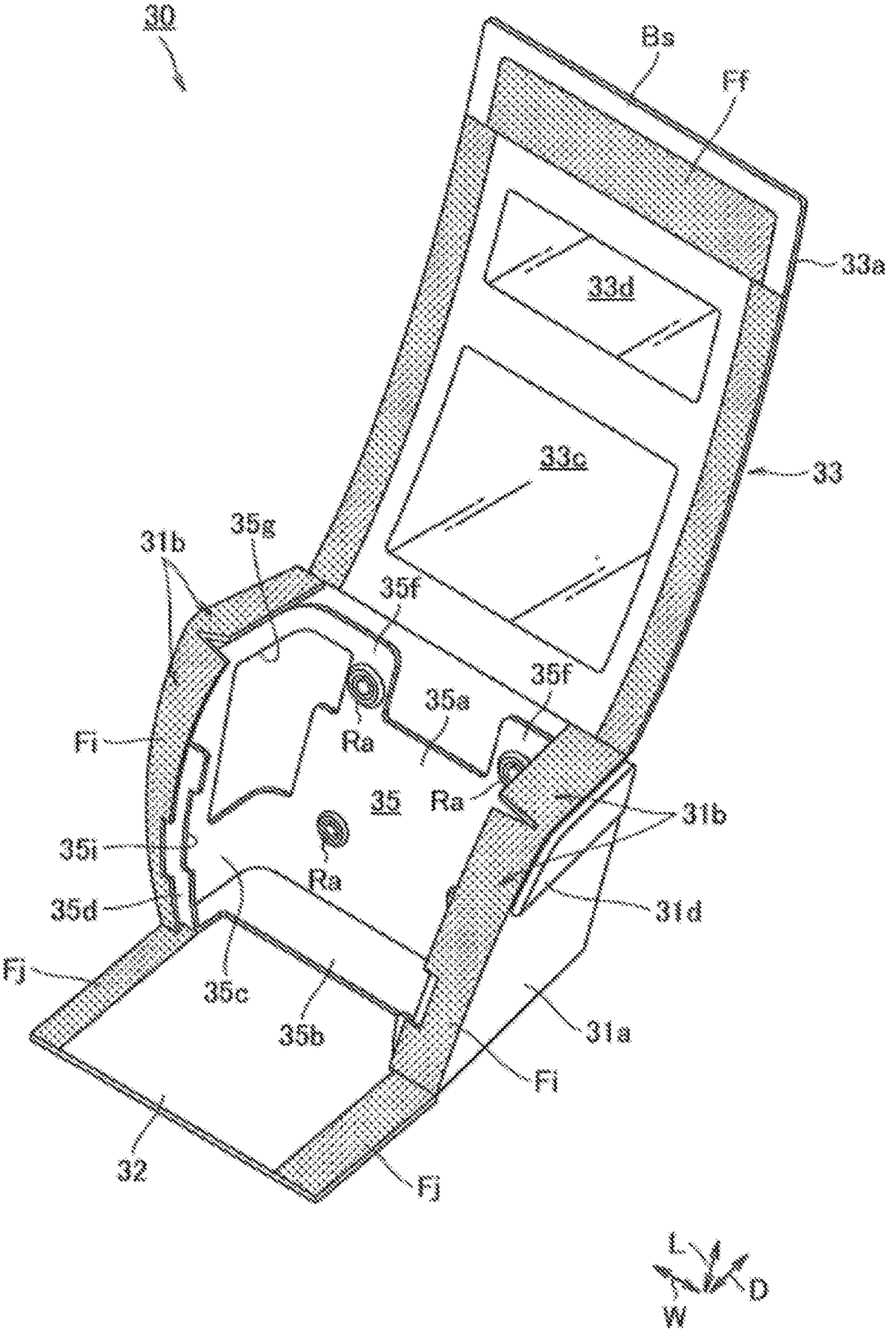
FIG. 10 is a perspective view of the storage case shown in FIG. 9 and is seen from an upper right front side.
Figure 11:
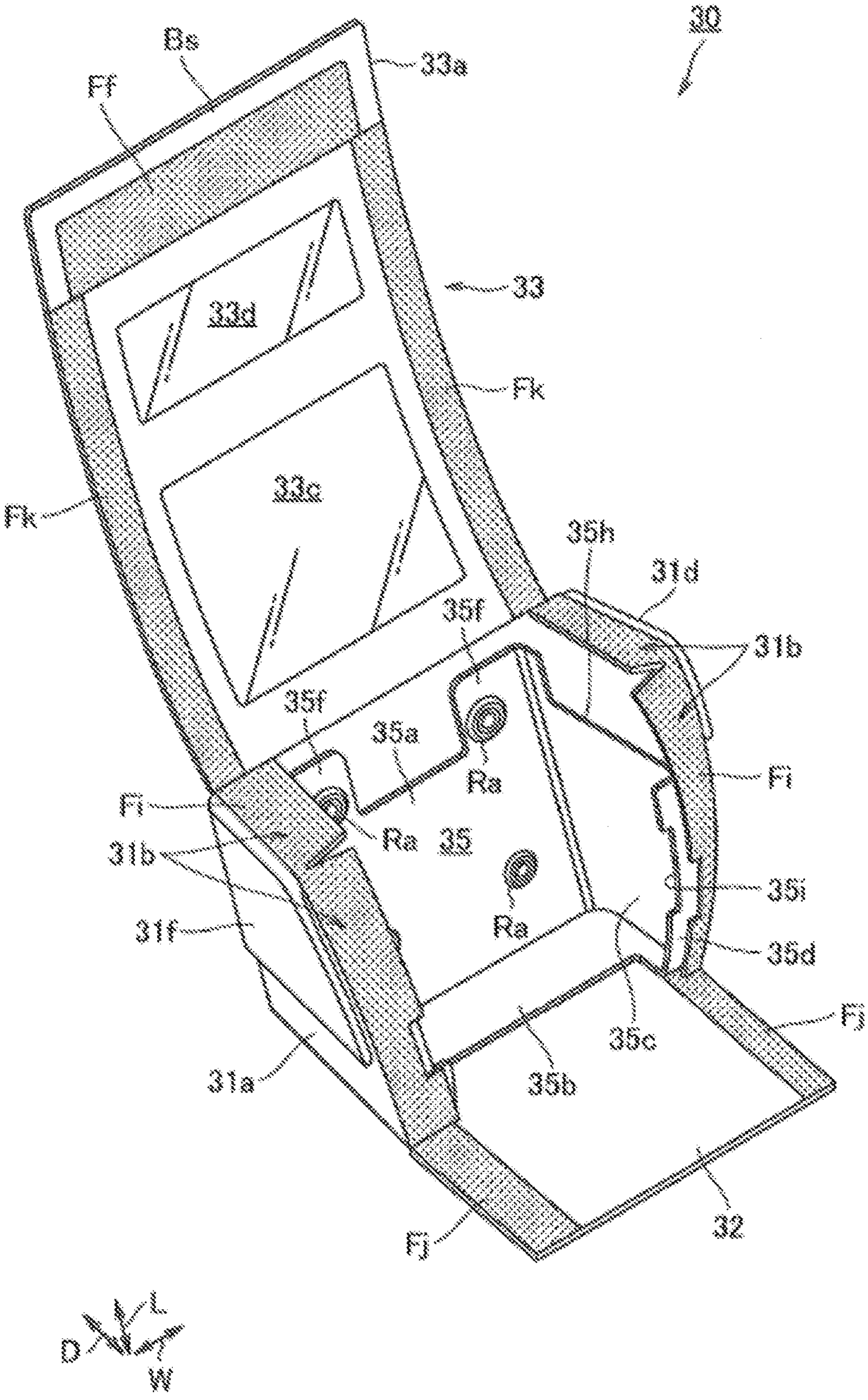
FIG. 11 is a perspective view of the storage case shown in FIG. 9 and is seen from an upper left front side.
Figure 12:
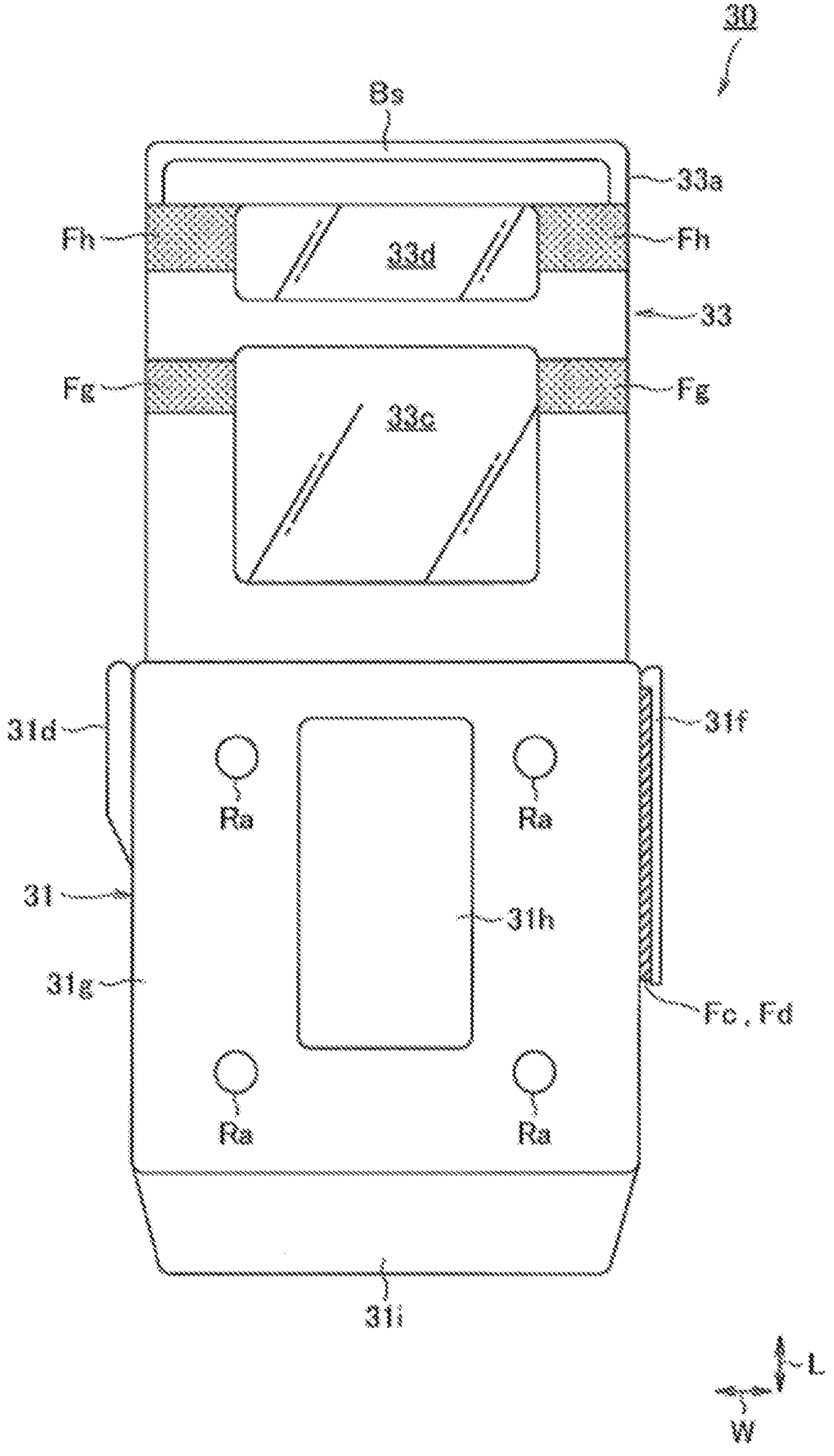
FIG. 12 is a perspective view of the storage case shown in FIG. 9 and is seen from a back side.
Figure 13:
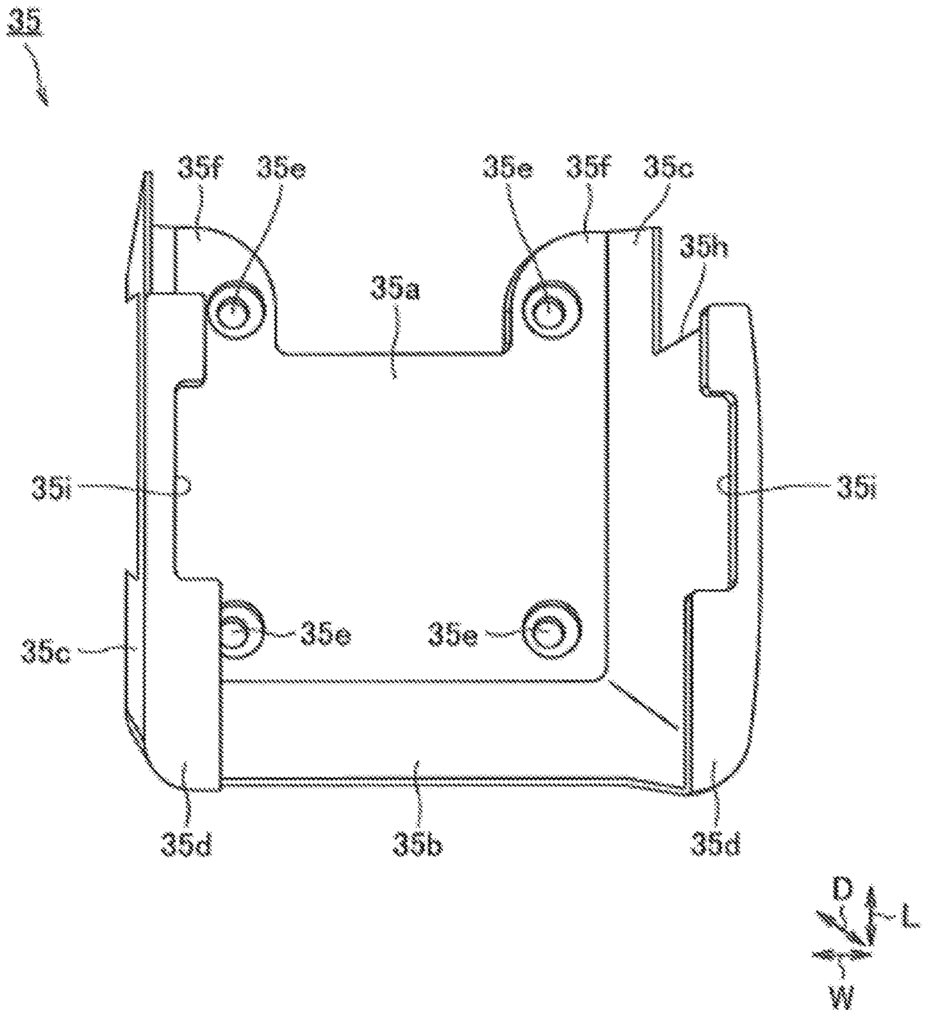
FIG. 13 is a perspective view of a printer holder taken out from the interior of the storage case shown in FIG. 9 and is seen from a front side.
Figure 14:
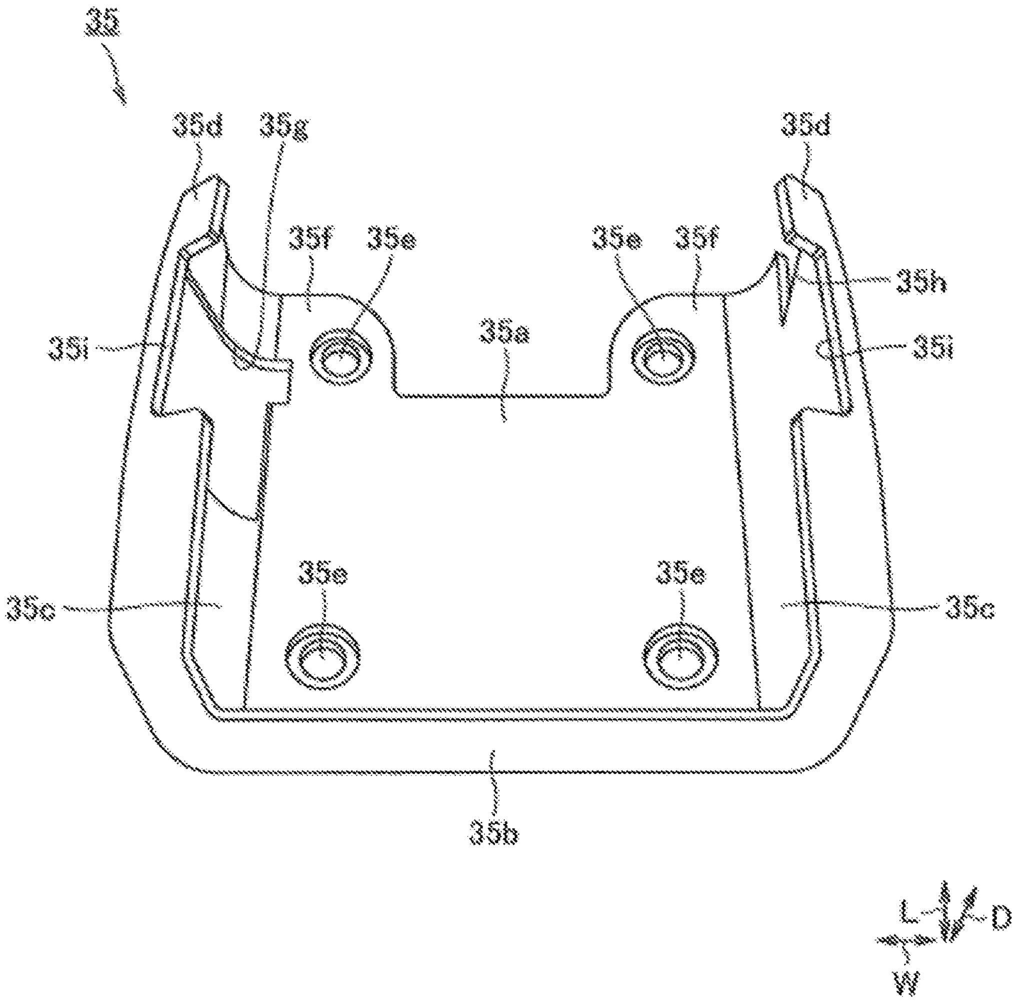
FIG. 14 is a perspective view of the printer holder shown in FIG. 13 and is seen from a bottom side.
Figure 15:
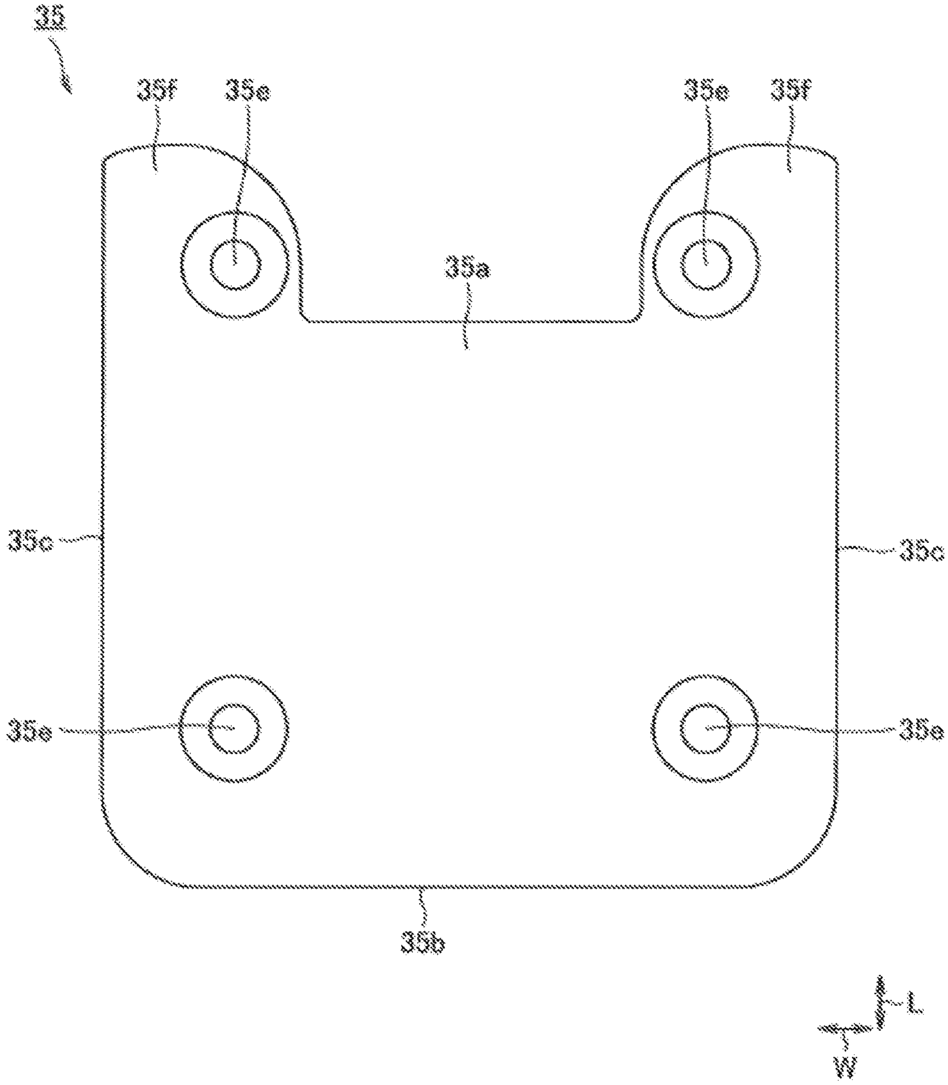
FIG. 15 is a plan view of the printer holder shown in FIG. 13 and is seen from a back side.

Next, FIG. 9 is a perspective view of the storage case in a condition that the upper cover and a lower cover are opened. FIG. 10 is a perspective view of the storage case shown in FIG. 9 and is seen from an upper right front side. FIG. 11 is a perspective view of the storage case shown in FIG. 9 and is seen from an upper left front side. FIG. 12 is a perspective view of the storage case shown in FIG. 9 and is seen from a back side. FIG. 13 is a perspective view of a printer holder taken out from the interior of the storage case shown in FIG. 9 and is seen from a front side. FIG. 14 is a perspective view of the printer holder shown in FIG. 13 and is seen from a bottom side. FIG. 15 is a plan view of the printer holder shown in FIG. 13 and is seen from a back side.

As shown in FIGS. 9 to 11, the case body 31 of the storage case 30 is provided with a pair of surface fasteners Fi on the external surfaces of the pair of the protrusions 31*b*. Additionally, the lower cover 32 is provided with a pair of surface fasteners Fj on its back surface. As shown in FIGS. 10 and 11, the surface fasteners Fj are disposed in the vicinity of the both width directional ends of the lower cover 32 and extend in a band-like shape along the edges of the width directional ends of the lower cover 32. The surface fasteners Fi and Fj enable the lower cover 32 to be attached to or detached from the pair of the protrusions 31*b*.

Additionally, as shown in FIGS. 9 to 11, the upper cover 33 is provided with a pair of surface fasteners Fk on its back surface. The surface fasteners Fk are disposed on planer parts facing to the pair of the protrusions 31*b*. The surface fasteners Fi and Fk enable the upper cover 33 to be attached to or detached from the pair of the protrusions 31*b*.

In the case body 31 of the storage case 30 constructed as described above, a width Wp (see FIG. 4) of each of the pair of the protrusions 31*b* is arbitrarily set as long as contact tightness can be reliably achieved between the pair of the protrusions 31*b* (i.e., the case body 31) and both the lower cover 32 and the upper cover 33. For example, the width Wp is set to be around 5 to 15 mm.

Additionally, in the present exemplary embodiment, as shown in FIGS. 9 to 11, a printer holder 35 is installed and fixed to the interior of the storage case 30. The printer holder 35 is a holding member for mainly holding the portable printer 1 stored in the storage case 30. The printer holder 35 is made of, for instance, material (e.g., resin or hard rubber) harder than that of the storage case 30. The printer holder 35 is an integrated member composed of aback surface 35*a*, a bottom surface 35*b*, a pair of lateral surfaces 35*c* and a pair of protrusions 35*d* (exemplary first protrusions).

The back surface 35*a* of the printer holder 35 is a part for covering the back surface of the portable printer 1. The printer holder 35 is fixed to the storage case 30 by rivets Ra that are fastened to overlap the back surface 35*a* and the back surface 31g of the case body 31. For example, the back surface 35*a* is provided with rivet holes 35*e* (see FIGS. 13 to 15) in four positions. The rivets Ra are inserted through the rivet holes 35*e*.

The back surface 35*a* includes projecting parts 35*f* upwardly projecting from the vicinity of the both ends of the upper region thereof in the width direction W. Each of the projecting parts 35*f* is provided with each of the upper-side rivet holes 35*e*. With this construction, as shown in FIG. 12, the positions of the upper-side two of the rivets Ra can be shifted not to overlap with the belt of the worker. Hence, it is possible to prevent damage, scratch or so forth of the belt attributed to the rivets Ra.

Additionally, the printer holder 35 is provided with the back surface 35*a*, and accordingly, the storage case 30 can be enhanced in mechanical strength on its back surface. Hence, the storage case 30 can be enhanced in stability when being attached to the belt of the worker.

The bottom surface 35*b* of the printer holder 35 is a part for supporting the bottom surface of the portable printer 1. As shown in FIGS. 10, 11 and 14, the bottom surface 35*b* is shaped to cover approximately half the bottom surface of the portable printer 1 in the depth direction D. With this construction, the opening and closing cover 3 of the portable printer 1 stored in the storage case 30 can be opened while the portable printer 1 stored in the storage case 30 is supported by the bottom surface 35*b* of the printer holder 35.

The pair of the lateral surfaces 35*c* of the printer holder 35 are parts for covering the both lateral surfaces of the portable printer 1. As shown in FIGS. 9, 10 and 14, the printer holder 35 is provided with a hole portion 35*g* (exemplary first opening). The hole portion 35*g* is provided in one lateral surface 35*c* and is located in a corresponding position to the battery cover 11 of the portable printer 1. With the hole portion 35*g* being herein provided, the battery Bt can be replaced by opening the battery cover 11 of the portable printer 1, while the portable printer 1 is stored in the storage case 30. A cutout portion may be provided instead of the hole portion. However, providing the hole portion has merit in that the mechanical strength of the one lateral surface 35*c* of the printer holder 35 and the performance of holding the portable printer 1 can be enhanced.

Additionally, as shown in FIGS. 11 and 13, the printer holder 35 is provided with a cutout portion 35*h* (exemplary second opening). The cutout portion 35*h* is provided in the other lateral surface 35*c* and is located in a corresponding position to an interface part such as the adapter connection terminal 10. The cutout portion 35*h* is shaped to be matched with the aforementioned hole portion 31*c* (see FIG. 6) of the storage case 30. With this construction, the adapter connection terminal 10 can be exposed by opening the aforementioned side cover 31*d* of the storage case 30. Therefore, the AC adapter Ad can be electrically connected to the adapter connection terminal 10 of the portable printer 1, while the portable printer 1 is stored in the storage case 30. A hole portion may be provided instead of the cutout portion. In this case, the mechanical strength of the other lateral surface 35*c* of the printer holder 35 and the performance of holding the portable printer can be enhanced.

The pair of the protrusions 35*d* of the printer holder 35 is a pair of parts for covering part of the front surface of the portable printer 1. The pair of the protrusions 35*d* is shaped to partially protrude from the pair of the lateral surfaces 35*c* of the printer holder 35 to the front side of the portable printer 1 and to extend from the bottom side of the portable printer 1 to a position above the middle of the portable printer 1 in the lengthwise direction L. The portable printer 1 stored in the storage case 30 is configured to be held by the pair of the protrusions 35*d* so as not to drop from the front side of the storage case 30. As shown in FIGS. 9 to 11, the pair of the protrusions 35*d* is configured to be covered with the pair of the protrusions 31*b* of the storage case 30.

Additionally, the pair of the protrusions 35*d* of the printer holder 35 is provided with a pair of recesses 35*i* in their intermediate positions in the lengthwise direction L. The recesses 35*i* are respectively recessed toward the lateral surfaces 35*c*. As described below, the recesses 35*i* are recessed for preventing the protrusions 35*d* from making contact with part of the opening and closing cover 3 of the portable printer 1 in opening and closing the opening and closing cover 3.

Figure 16:
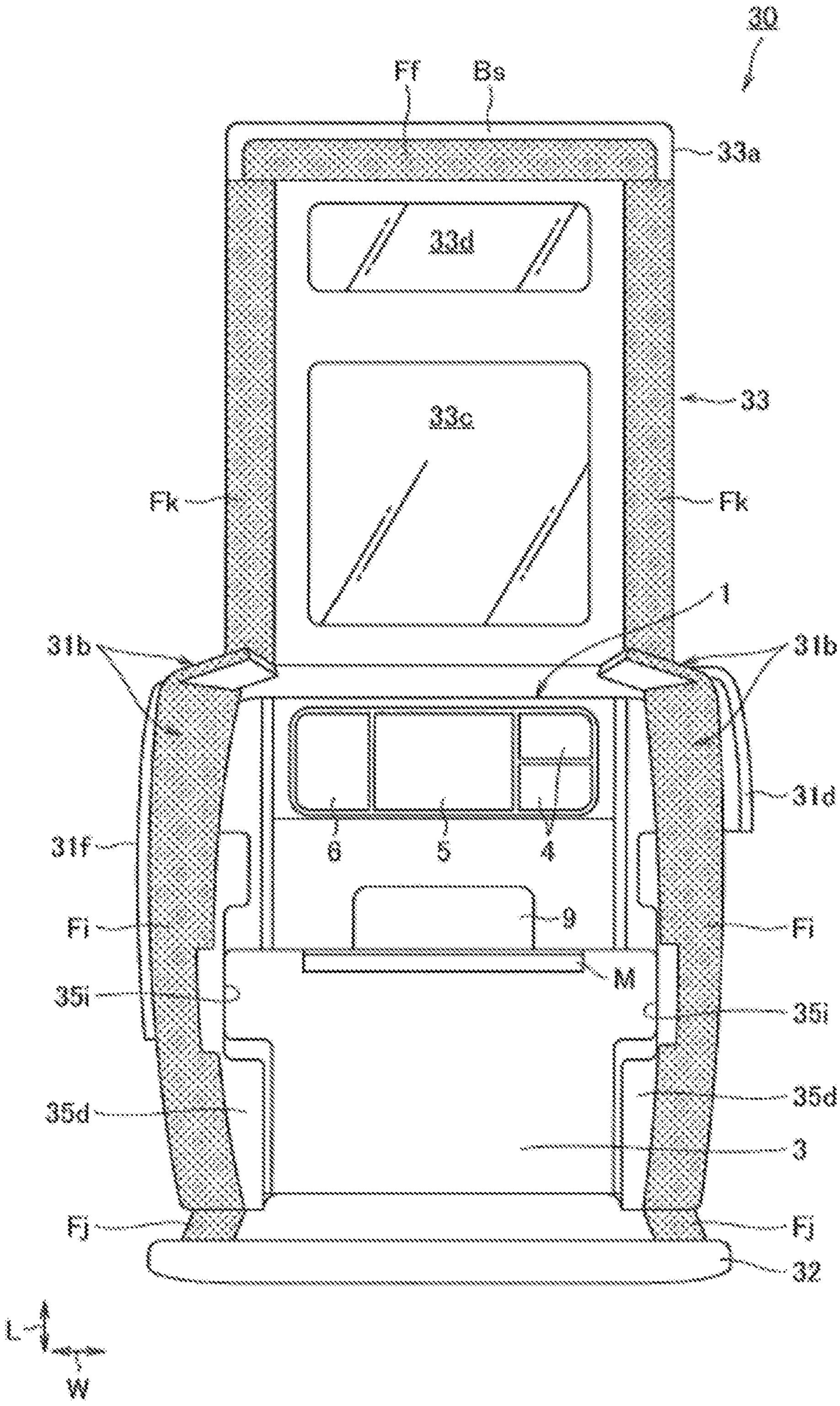
FIG. 16 is a perspective view of the storage case shown in FIG. 9 and shows a condition that the portable printer is stored in the storage case.
Figure 17:
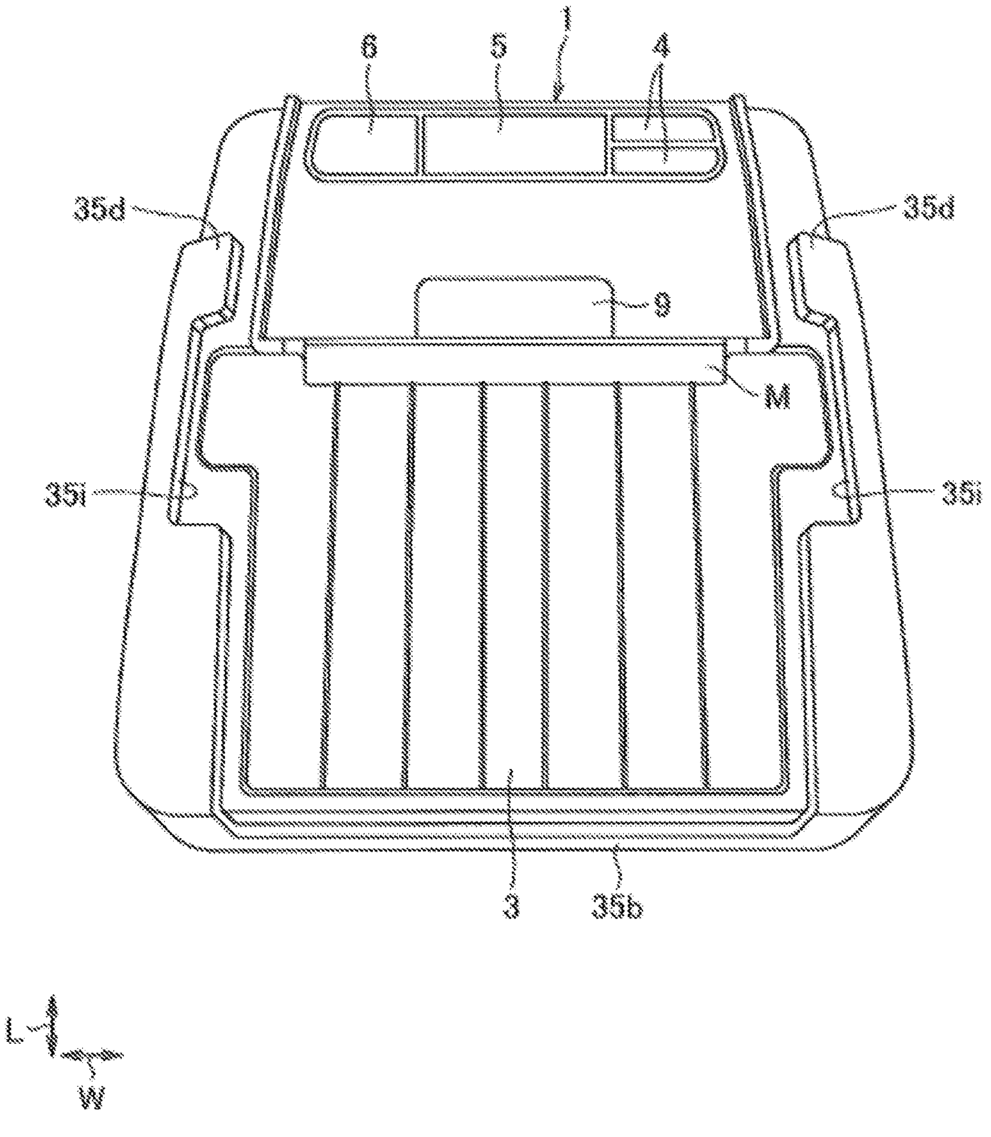
FIG. 17 is a perspective view of both the portable printer and the printer holder taken out from the storage case shown in FIG. 16.
Figure 18:
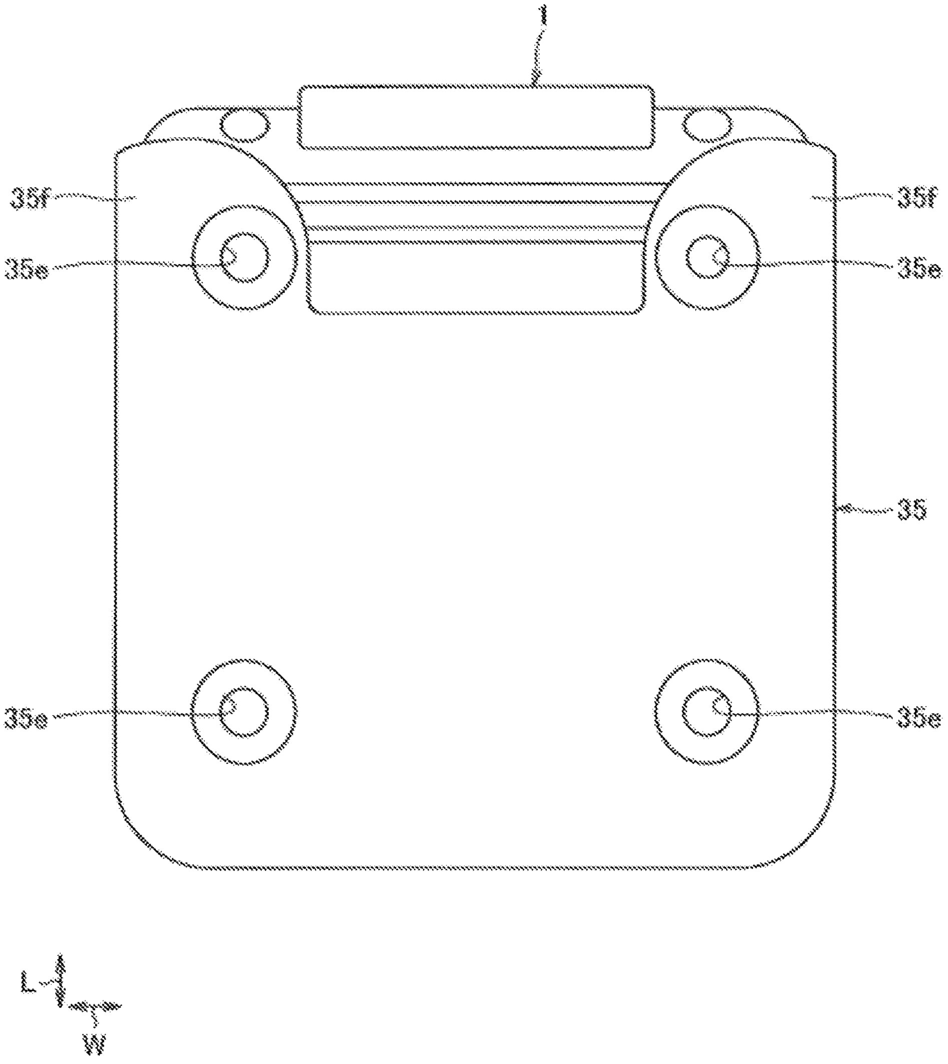
FIG. 18 is a plan view of both the portable printer and the printer holder shown in FIG. 17 and is seen from a back side.

Next, FIG. 16 is a perspective view of the storage case shown in FIG. 9 and shows a condition that the portable printer is stored in the storage case. FIG. 17 is a perspective view of both the portable printer and the printer holder taken out from the storage case shown in FIG. 16. FIG. 18 is a plan view of both the portable printer and the printer holder shown in FIG. 17 and is seen from a back side.

The portable printer 1 is stored in the storage case 30, while the opening and closing cover 3 is located on the lower side (in other words, while the label supplying part 15 is located on the lower side). The portable printer 1 stored in the storage case 30 is firmly held by the printer holder 35, while part of its front surface is supported by the pair of the protrusions 35*d* of the printer holder 35.

In the storage case 30, while the portable printer 1 is stored in the storage case 30, the printed labels PL can be ejected by opening the upper cover 33, and the continuous label stock P of the portable printer 1 can be stored in the label supplying part 15 of the portable printer 1 by opening the lower cover 32. Hence, good operability and good usability of the portable printer 1 can be reliably achieved, while good waterproofing and dust-proofing can be reliably achieved. Contrary to the pros, when not provided with the printer holder 35, the storage case 30 has chances that the portable printer 1 stored therein inevitably drops from the front side of the storage case 30 if the lower cover 32 is not firmly closed or is forgotten to be closed.

By contrast, in the present exemplary embodiment, the printer holder 35 is mounted to the interior of the storage case 30. Even if the lower cover 32 of the storage case 30 is not firmly closed or is forgotten to be closed, the portable printer 1 stored in the storage case 30 can be firmly held by the printer holder 35. Hence, the portable printer 1 can be prevented from dropping from the front side of the storage case 30.

Additionally, in the present exemplary embodiment, the portable printer 1 stored in the storage case 30 can be firmly held by the printer holder 35. Hence, a variety of works such as operation of the portable printer 1 and cutting of the continuous label stock P can be stably performed. In this case, the pair of the protrusions 35*d* of the printer holder 35 is shaped to support the portable printer 1 in a region ranging from the bottom side of the portable printer 1 to the position above the half of the portable printer 1 in the lengthwise direction L (e.g., a position above the cover open button 9 of the portable printer 1). Thus, holding performance or stability of the portable printer 1 can be enhanced by covering and supporting the region ranging to or above the half of the portable printer 1 in the lengthwise direction with the pair of the protrusions 35*d*. For example, the portable printer 1 can be prevented from dropping even when the lower part of the portable printer 1 becomes lighter than the upper part thereof due to usage of the continuous label stock P and thereby the center of mass of the portable printer 1 shifts upward.

Additionally, as described above, the printer holder 35 is made of material (e.g., resin, hard rubber, etc.) harder than the storage case 30. With this construction, the printer holder 35 functions not only as a holder of the portable printer 1 but also as part of the frame of the storage case 30 or part of the outer shell of the portable printer 1 in the interior of the storage case 30.

In other words, the printer holder 35 is mounted to the interior of the storage case 30, and thereby, the storage case 30 is supported by the printer holder 35. Hence, degradation (i.e., fatigue-related deformation) in contour condition of the storage case 30 can be inhibited or prevented. Especially, the pair of the protrusions 35*d* of the printer holder 35 is disposed on the back side of the pair of the protrusions 31*b* of the storage case 30, and thereby, wrinkling of the pair of the protrusions 31*b* of the storage case 30 can be inhibited.

Additionally, as shown in FIG. 16, the pair of the protrusions 35*d* of the printer holder 35 is provided on the back side of the pair of the protrusions 31*b* of the storage case 30. Therefore, when the lower cover 32 and the upper cover 33 of the storage case 30 are pressed and stuck to the pair of the protrusions 31*b* of the storage case 30, the pair of the protrusions 35*d* of the printer holder 35 backs up this condition. Hence, the lower cover 32 and the upper cover 33 can be firmly closed. In other words, contact tightness can be enhanced between the case body 31 and both the lower cover 32 and the upper cover 33 in the storage case 30.

Additionally, the external surface of the portable printer 1 stored in the storage case 30 can be protected by the printer holder 35. Hence, even when the storage case 30 in which the portable printer 1 is stored is erroneously dropped and so forth, shock acting on the portable printer 1 can be eased, and damage or scratch of the portable printer 1 can be reduced. Especially, when the printer holder 35 is made of hard rubber or so forth, the printer holder 35 absorbs shock. Hence, shock acting on the portable printer 1 can be further eased.

Additionally, the printer holder 35 is made of resin, hard rubber or so forth, and thereby, durability of the printer holder 35 per se can be enhanced. Incidentally, it can be assumed to mount core members to the interior of the storage case 30. In this construction, an additional number of steps are required to fabricate the storage case 30. In other words, it takes time to fabricate the storage case 30, and moreover, increase in cost of the storage case 30 is inevitable. By contrast, as to the printer holder 35, mass production is enabled by casting or molding. Hence, it is relatively easy to fabricate the printer holder 35. In other words, the fabricating time of the storage case 30 can be reduced, and moreover, cost increase can be inhibited.

Additionally, as shown in FIG. 18, when the portable printer 1 is stored in the storage case 30, part of an upper region of the back surface of the portable printer 1 is exposed between the two projecting parts 35*f* provided on an upper region of the back surface of the printer holder 35. The exposed region of the back surface of the portable printer 1 is configured to be pinched by the worker in inserting/taking the portable printer 1 into/from the storage case 30. With this construction, damage or scratch of the belt of the worker can be prevented by disposing the rivets Ra in the projecting parts 35*f* as described above, and simultaneously, it is possible to reliably produce the region configured to be pinched in inserting/taking the portable printer 1 into/from the storage case 30.

Next, an exemplary method of using the storage case 30 according to the present exemplary embodiment will be explained with reference to FIGS. 19 to 22.

Figure 19:
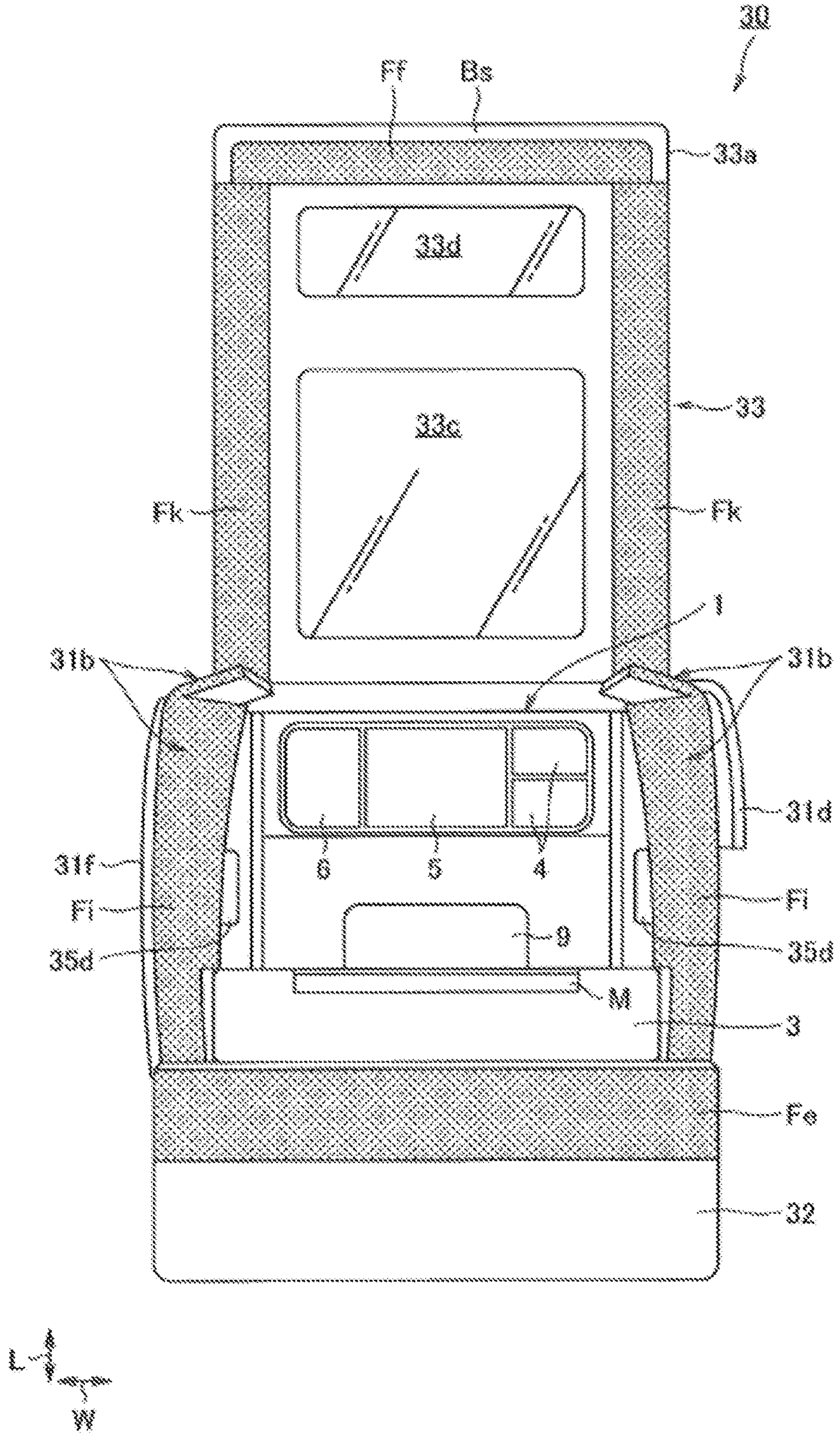
FIG. 19 is a perspective view of both the portable printer and the storage case on the way to store the portable printer in the storage case.
Figure 20:
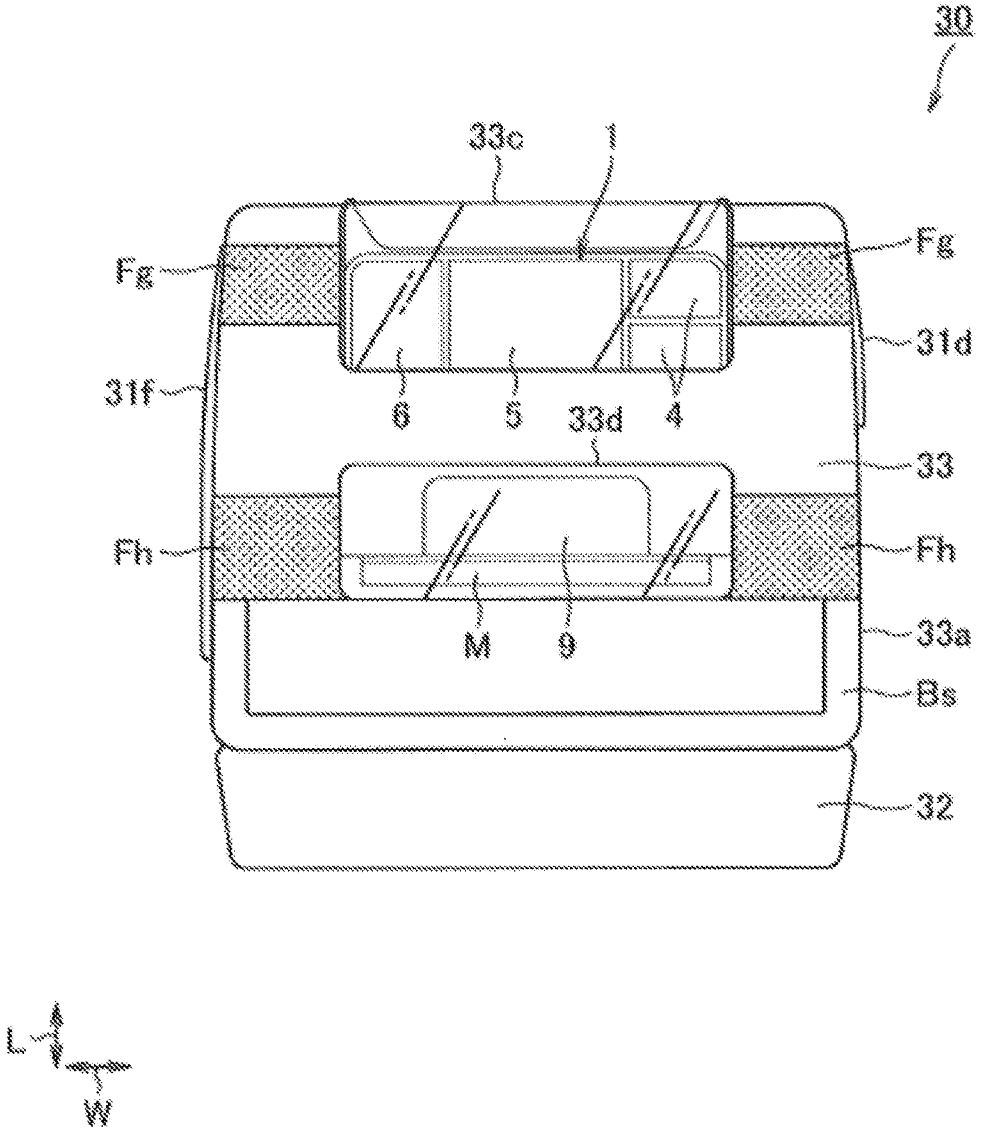
FIG. 20 is a perspective view of both the portable printer and the storage case after the portable printer is stored in the storage case.

First, FIG. 19 is a perspective view of both the portable printer and the storage case on the way to store the portable printer in the storage case, whereas FIG. 20 is a perspective view of the portable printer and the storage case after the portable printer is stored in the storage case.

First, as shown in FIG. 9 and so forth, the worker sets the portable printer 1 in the printer holder 35 of the storage case 30 while the lower cover 32 and the upper cover 33 of the storage case 30 are fully opened. In this condition, the upper cover 33 is openable to the upper end of the back surface of the case body 31, while the lower cover 32 is openable to the end of the bottom surface of the case body 31. Hence, the portable printer 1 can be easily set in the printer holder 35.

Subsequently, as shown in FIG. 19, the lower cover 32 is closed by upwardly moving the tip end of the lower cover 32 of the storage case 30 and sticking the surface fasteners Fj on the back surface of the lower cover 32 to the surface fasteners Fi on the pair of the protrusions 31*b* of the storage case 30. Then as shown in FIG. 20, the upper cover 33 is closed to seal the storage case 30 by downwardly moving the flap plate 33*a* disposed on the tip end of the upper cover 33 of the storage case 30 and sticking the surface fastener Ff on the back surface of the flap plate 33*a* to the surface fastener Fe on the external surface of the lower cover 32 such that the surface fasteners Ff and Fe overlap with each other, and simultaneously, by sticking the surface fasteners Fk on the back surface of the upper cover 33 to the surface fasteners Fi on the pair of the protrusions 31*b* of the storage case 30. Accordingly, the portable printer 1 stored in the storage case 30 can be enhanced in waterproofing and dust-proofing.

Additionally, as shown in FIG. 20, the operating parts 4, the display 5 and the electric power button 6 of the portable printer 1 stored in the storage case 30 are viewable through the first transparent window 33*c* of the upper cover 33. Hence, while the portable printer 1 is stored in the storage case 30, the worker can operate the operating parts 4, watch the display 5, watch the power-on/off state of the portable printer 1 and turn on/off the electric power button 6. Additionally, the cover open button 9 of the portable printer 1 stored in the storage case 30 is viewable through the second transparent window 33*d* of the upper cover 33. Hence, there is little chance of unintentionally pressing the cover open button 9.

Figure 21:
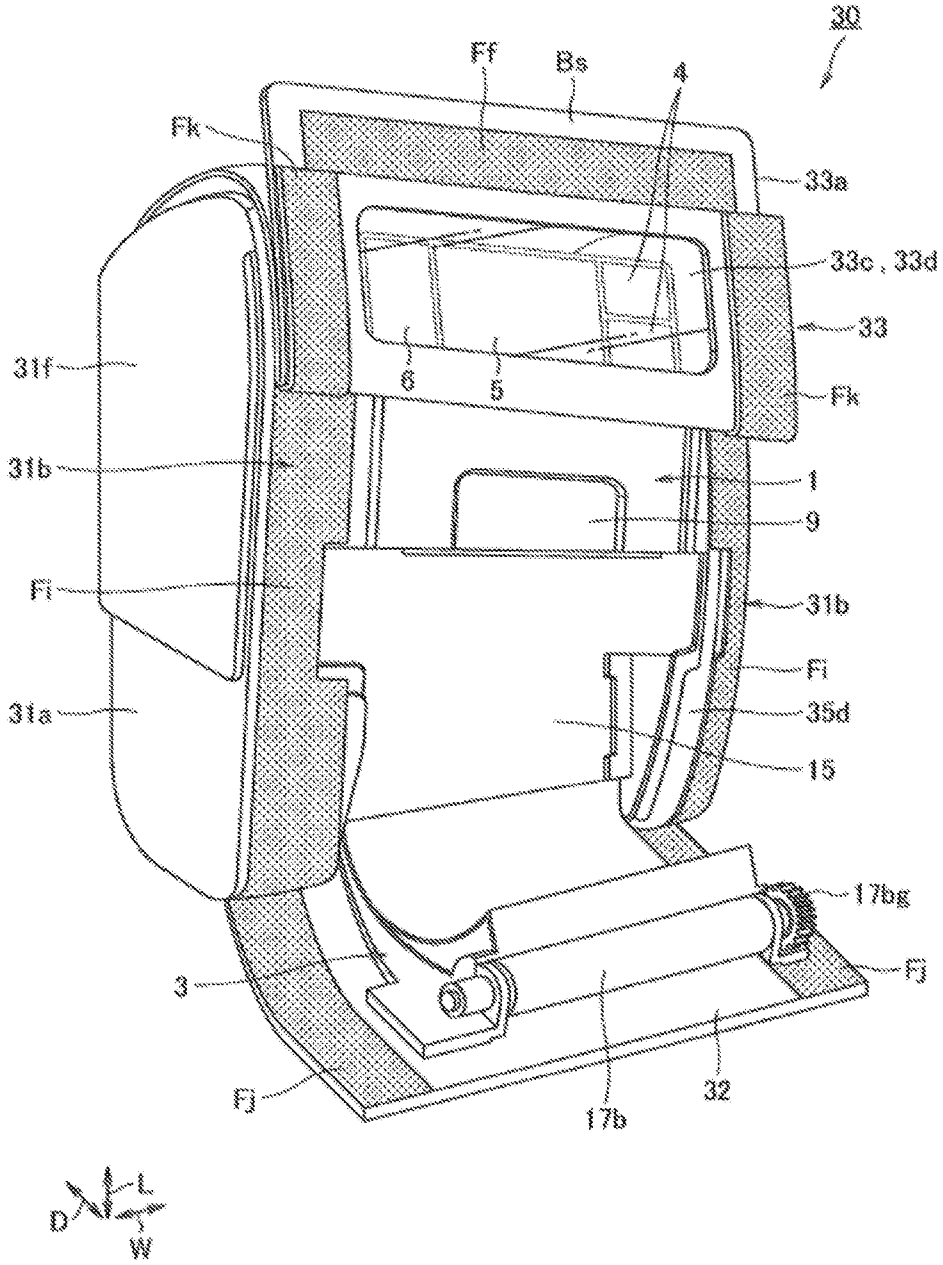
FIG. 21 is a perspective view of both the portable printer and the storage case in the middle of a process of inserting a continuous label stock into the portable printer stored in the storage case.

Next, FIG. 21 is a perspective view of both the portable printer and the storage case in the middle of a process of inserting the continuous label stock into the portable printer stored in the storage case.

In inserting the continuous label stock P into the label supplying part 15 of the portable printer 1 stored in the storage case 30, firstly, the worker upwardly bends the tip end of the upper cover 33 along the bent groove 33*b* (see FIG. 4 and so forth) of the upper cover 33, and presses and sticks the surface fasteners Fh (see FIG. 20 and so forth) provided on the tip end of the external surface of the upper cover 33 to the surface fasteners Fg (see FIG. 20 and so forth) provided on the upper region of the external surface of the upper cover 33. Accordingly, as shown in FIG. 21, the ejection port M of the portable printer 1 stored in the storage case 30 is exposed to the outside. At this time, the operating parts 4, the display 5 and the electric power button 6 of the portable printer 1 stored in the storage case 30 are viewable through the double glazing part produced by overlapping the first and second transparent windows 33*c* and 33*d* of the upper cover 33.

Subsequently, the worker releases and downwardly opens the stuck lower cover 32 and presses the cover open button 9 of the portable printer 1 that is exposed through the storage case 30. Accordingly, the opening and closing cover 3 of the portable printer 1 is downwardly opened. Hence, the worker inserts the continuous label stock P (see FIG. 2 and so forth) into the label supplying part 15 through an opening produced by the opening and closing cover 3. Then, the worker closes the opening and closing cover 3 of the portable printer 1 and further closes the lower cover 32 of the storage case 30. At this time, the pair of the protrusions 35*d* of the printer holder 35 is provided on the back side of the pair of the protrusions 31*b* of the storage case 30. Hence, the lower cover 32 can be firmly closed.

Figure 22:
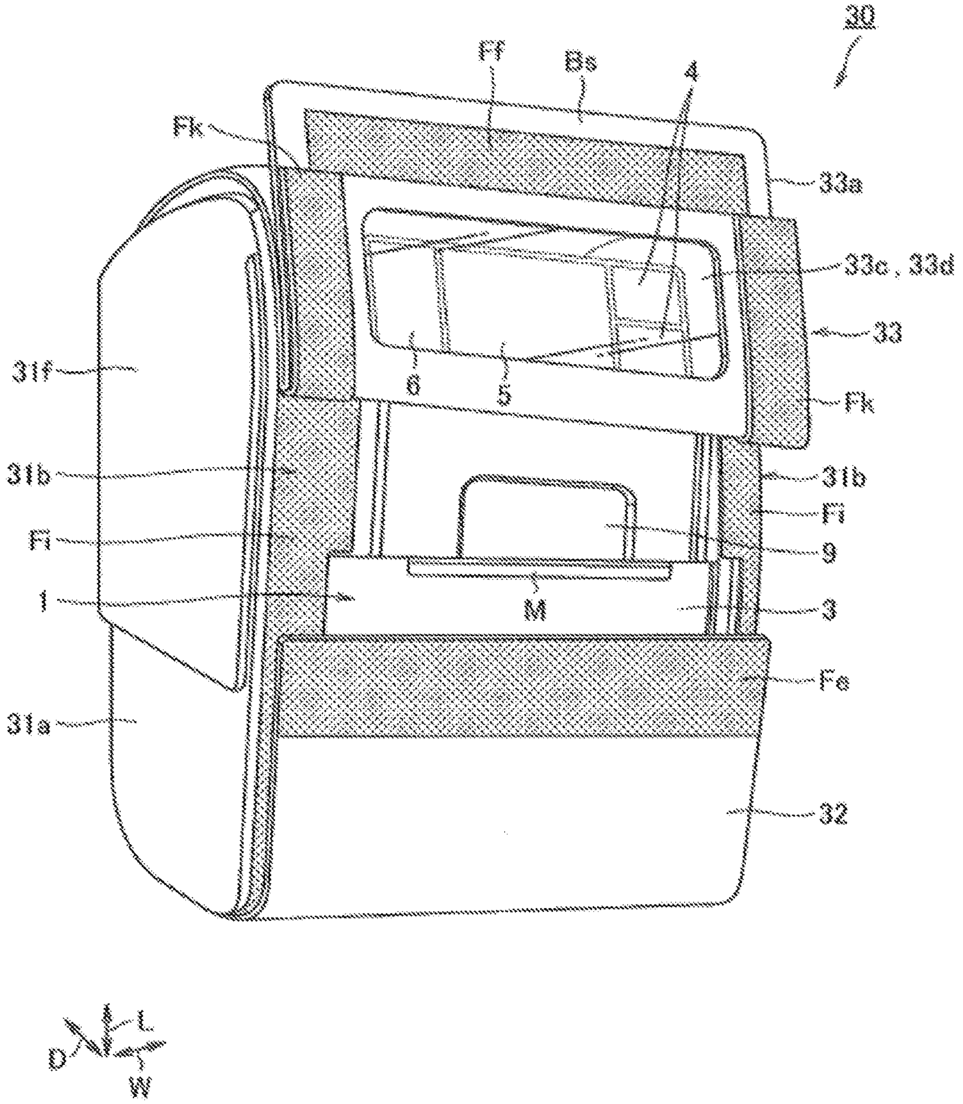
FIG. 22 is a perspective view of both the portable printer and the storage case and shows a condition of the portable printer stored in the storage case in a printing process.

Next, FIG. 22 is a perspective view of both the portable printer and the storage case and shows a condition of the portable printer stored in the storage case in a printing process.

When causing the portable printer 1 stored in the storage case 30 to perform a printing process for the labels PL of the continuous label stock P, similarly to the motions explained with reference to FIG. 21, the worker firstly bends the tip end of the upper cover 33 upward and sticks the tip end of the upper cover 33 to the upper region of the upper cover 33, and then, inputs desired information and command to the portable printer 1 stored in the storage case 30 by operating the operating parts 4 of the portable printer 1 through the double glazing part composed of the first and second transparent windows 33*c* and 33*d*. At this time, the first and second transparent windows 33*c* and 33*d* are made of soft material. Hence, the operating parts 4 can be easily and accurately operated from the outside of the double glazing part. Additionally, the inputted information and command can be visually confirmed on the display 5 through the double glazing part.

Through the operation described above, while the portable printer 1 is stored in the storage case 30, desired information is printed on the labels PL of the continuous label stock P by the printing part 17 (see FIG. 3) of the portable printer 1, and the printed continuous label stock P is then ejected through the ejection port M disposed on the front side of the portable printer 1. In this printing, most of the portable printer 1 can be covered with the storage case 30. Hence, the portable printer 1 can be enhanced in waterproofing and dust-proofing even when performing a printing motion. Additionally, the portable printer 1 stored in the storage case 30 can be firmly held by the printer holder 35 so as not to wobble and move. Hence, it is possible to stably perform works such as operating of the operating parts 4 of the portable printer 1 and cutting of the continuous label stock P. It should be noted that it is bothersome for a user to open and close the upper cover 33 at every printing ejection. Hence, the upper cover 33 is often kept bent and stuck to the upper part of the upper cover 33.

(Second Exemplary Embodiment)

Figure 23:
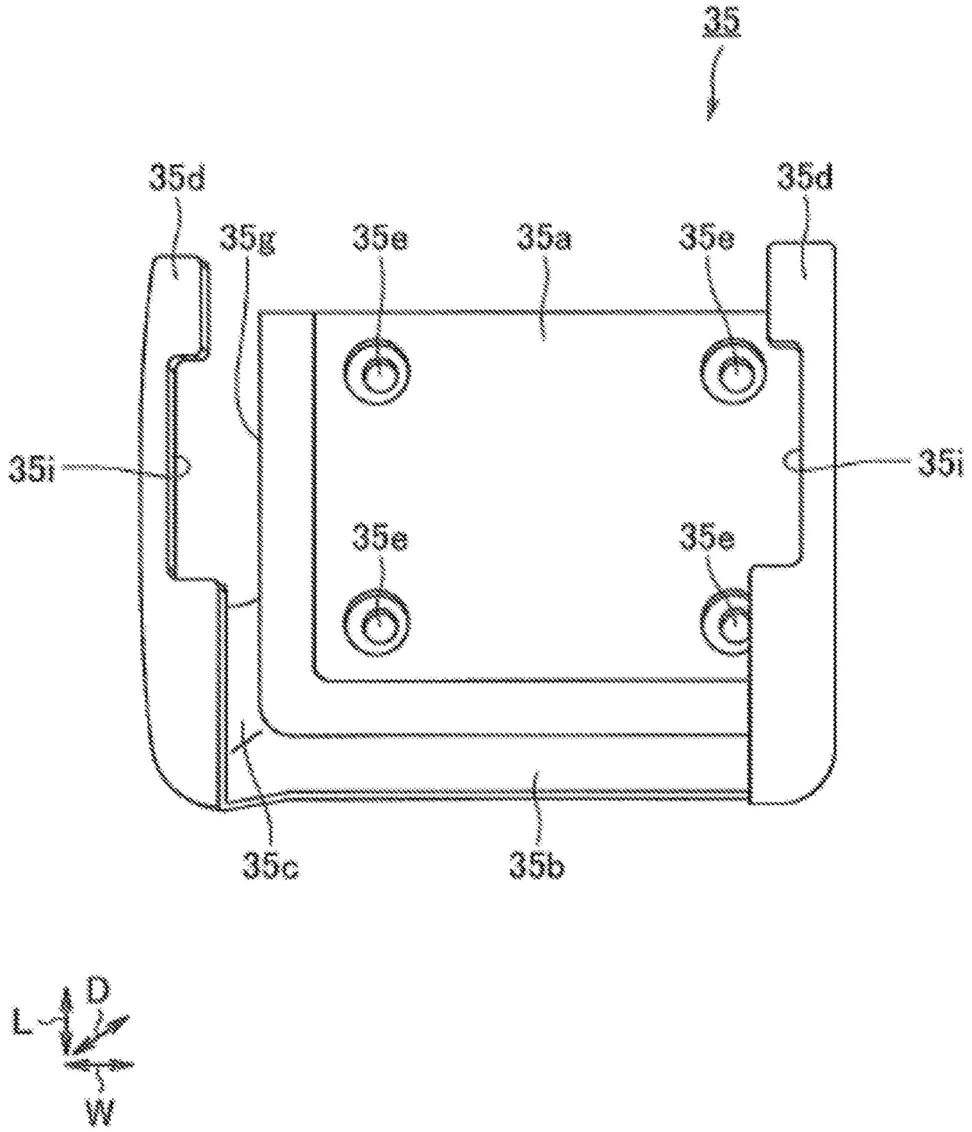
FIG. 23 is a perspective view of a printer holder taken out from a storage case according to a second exemplary embodiment of the present invention and is seen from a front side.
Figure 24:
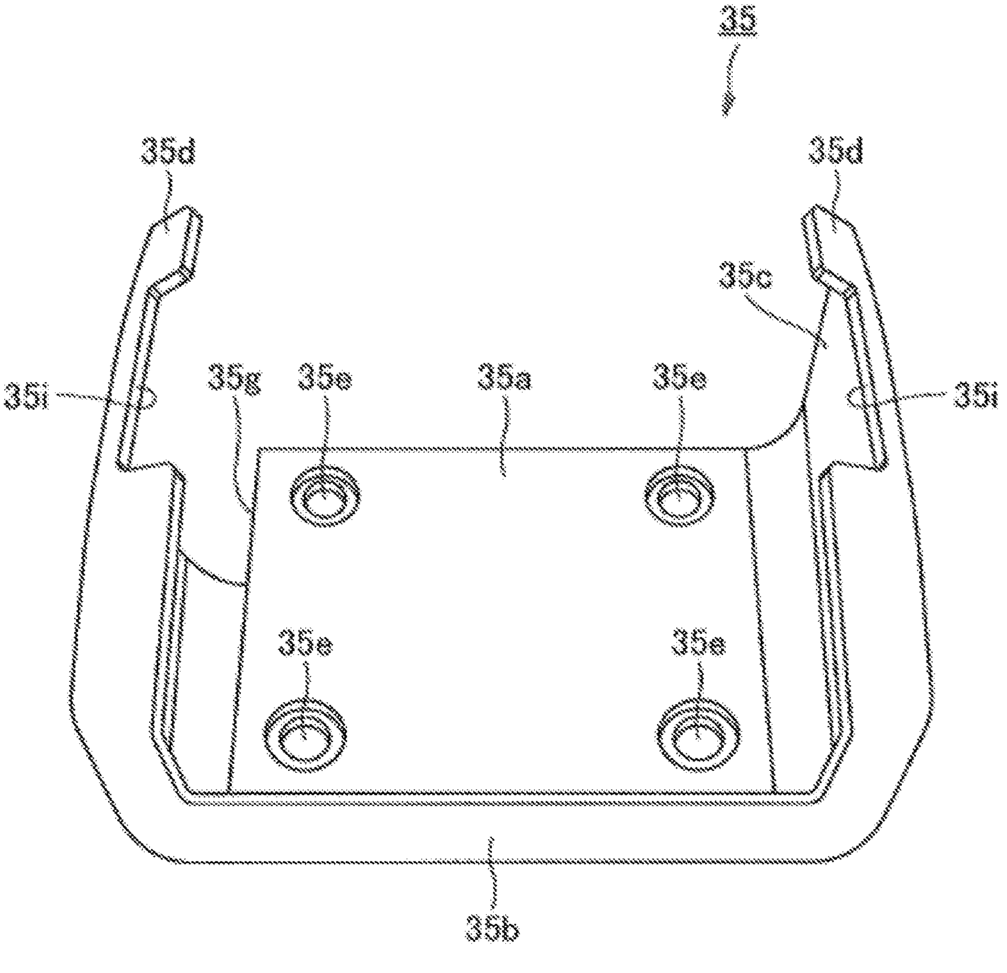
FIG. 24 is a perspective view of the printer holder shown in FIG. 23 and is seen from a bottom side.
Figure 25:
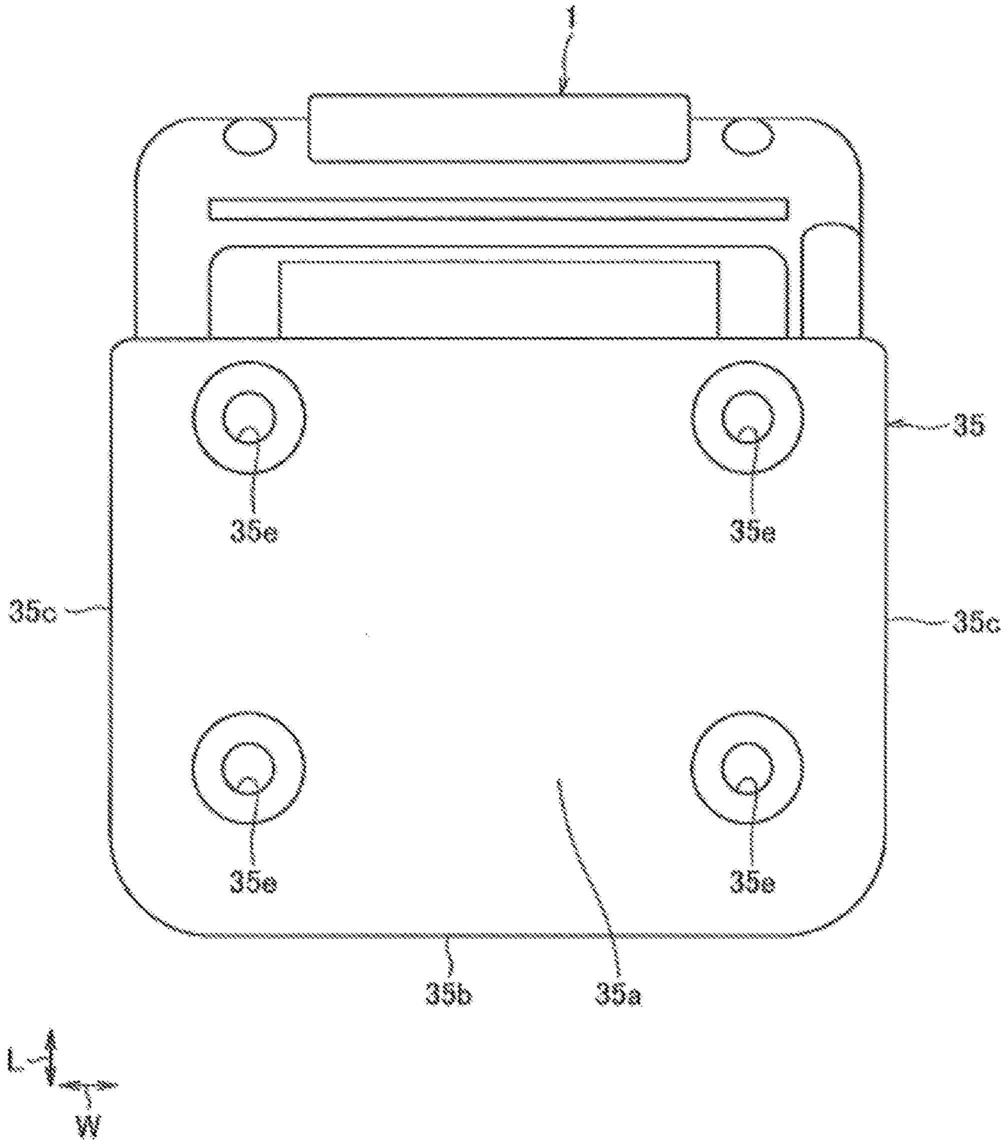
FIG. 25 is a plan view of the printer holder shown in FIG. 23 and is seen from a back side.

FIG. 23 is a perspective view of a printer holder taken out from a storage case according to a second exemplary embodiment of the present invention and is seen from a front side. FIG. 24 is a perspective view of the printer holder shown in FIG. 23 and is seen from a bottom side. FIG. 25 is a plan view of the printer holder shown in FIG. 23 and is seen from a back side. It should be noted that the constructions of the case body 31, the lower cover 32 and the upper cover 33 of the storage case 30 and the construction of the portable printer 1 are the same as those in the aforementioned first exemplary embodiment, and will not be hereinafter explained.

In the present exemplary embodiment, the printer holder 35 is not provided with the aforementioned projecting parts 35*f* (see FIGS. 13 to 15) atop the back surface 35*a* and the pair of the lateral surfaces 35*c*. In other words, in the printer holder 35, the outer edge of the upper region of the back surface 35*a* has the same height as the outer edges of upper regions of the pair of the lateral surfaces 35*c*. It should be noted that in this case, the upper region of one lateral surface 35*c* does not extend to the position of the adapter connection terminal 10 of the portable printer 1. Hence, the one lateral surface 35*c* is not provided with the aforementioned cutout portion 35*h* (see FIG. 13).

In the present exemplary embodiment herein described, it is possible to achieve not only advantageous effects similar to those achieved in the aforementioned first exemplary embodiment but also the following advantageous effects. Specifically, the printer holder 35 is simplified in contour. Hence, it is possible to produce the forming die or mold of the printer holder 35 with a simpler structure than that in the aforementioned first exemplary embodiment.

Additionally, as shown in FIG. 25, when the portable printer 1 is stored in the printer holder 35, the upper regions of the both lateral surfaces of the portable printer 1 are also exposed from the printer holder 35. Therefore, when taking the portable printer 1 from the storage case 30, the worker can grab the upper regions of the both lateral surfaces of the portable printer 1. In other words, the worker can take the portable printer 1 from the storage case 30 without touching the operating parts 4, the display 5 and the electric power button 6 of the portable printer 1. Therefore, when taking the portable printer 1 from the storage case 30, the worker can be prevented from erroneously pressing the operating parts 4 and the electric power button 6 or from touching and soiling the display 5.

(Third Exemplary Embodiment)

Figure 26:
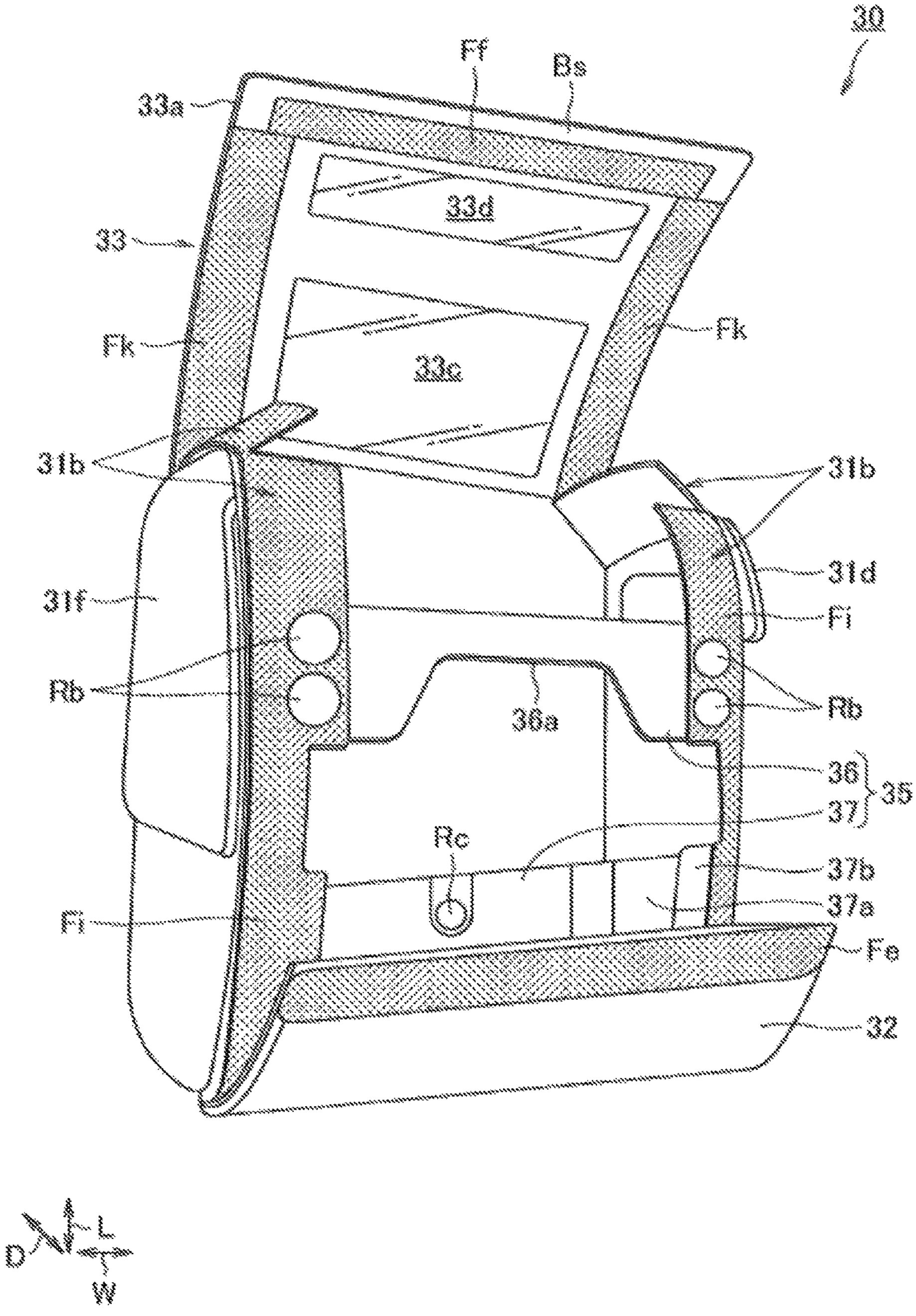
FIG. 26 is a perspective view of a storage case according to a third exemplary embodiment of the present invention and is seen from a front left side.
Figure 27:
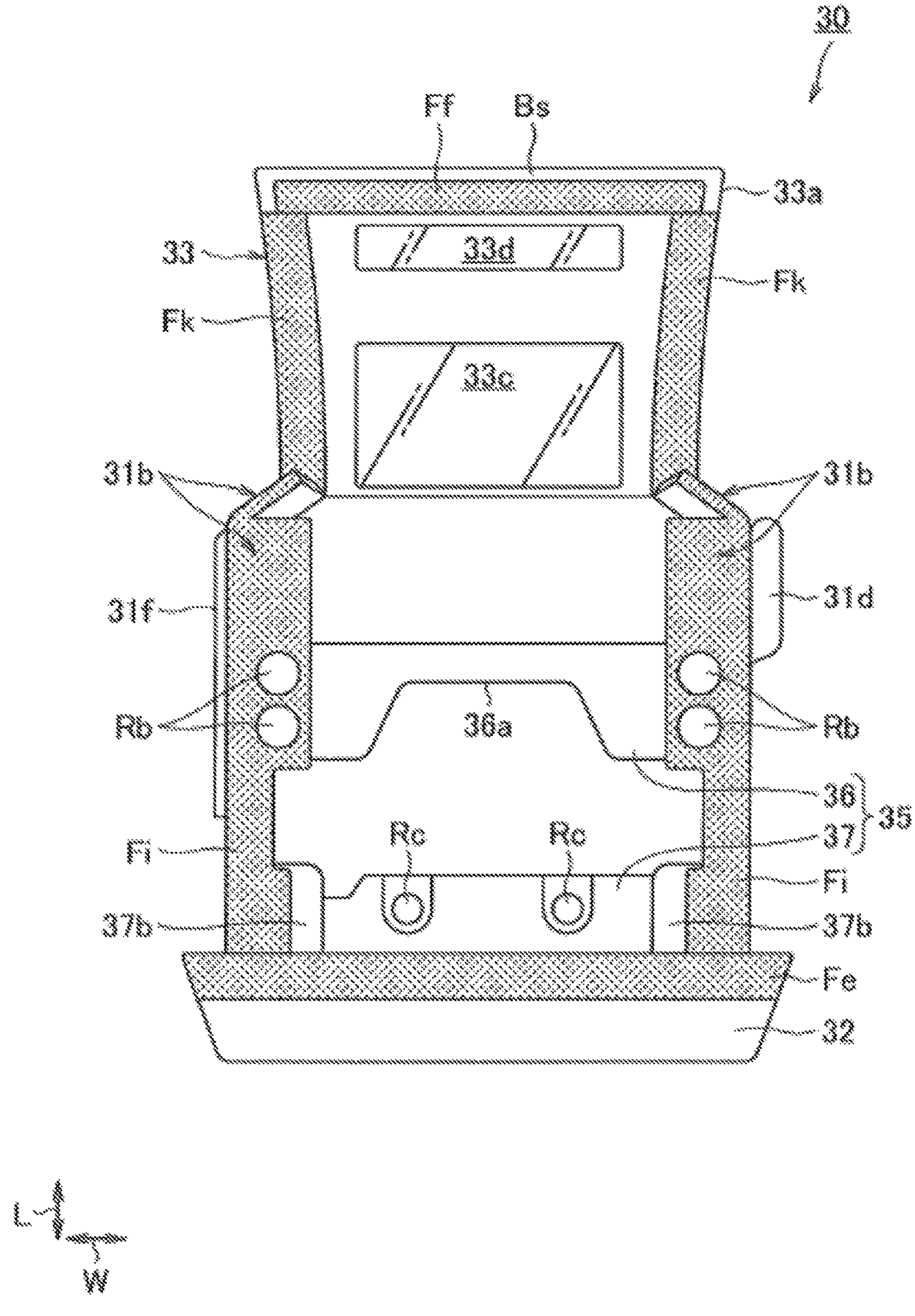
FIG. 27 is a perspective view of the storage case shown in FIG. 26 in a condition that an upper cover and a lower cover are opened.

FIG. 26 is a perspective view of a storage case according to a third exemplary embodiment of the present invention and is seen from a front left side. FIG. 27 is a perspective view of the storage case shown in FIG. 26 in a condition that an upper cover and a lower cover are opened. It should be noted that the constructions of the case body 31, the lower cover 32 and the upper cover 33 of the storage case 30 and the construction of the portable printer 1 are the same as those in the aforementioned first exemplary embodiment, and will not be hereinafter explained.

In the present exemplary embodiment, the printer holder 35 is divided into a front-side holder part 36 and a lower-side holder part 37. When stored in the storage case 30, the portable printer 1 is configured to be held by the front-side holder part 36 and the lower-side holder part 37.

The front-side holder part 36 is provided to be bridged between the pair of the protrusions 31*b* of the storage case 30, and is fixed at both lengthwise ends thereof to the pair of the protrusions 31*b* by rivets Rb. The front-side holder part 36 is provided with a recess 36*a* on a bottom one of the longer sides thereof. The recess 36*a* upwardly recesses to expose the cover open button 9 of the portable printer 1 therethrough.

The lower-side holder part 37 is installed in a lower part of the interior of the storage case 30. Additionally, the lower-side holder part 37 is installed in a position lower than the recesses 35*i* provided in the pair of the protrusions 35*d* of the printer holder 35 in the first exemplary embodiment. The lower-side holder part 37 is shaped to cover a lower region of the back surface, the bottom surface, lower regions of the pair of the both lateral surfaces and a lower region of the front surface of the portable printer 1.

The lower-side holder part 37 is fixed to the storage case 30 by, for instance, two rivets Rc. A bottom surface (not shown in the drawings) of the lower-side holder part 37 is a part for supporting the bottom surface of the portable printer 1. Similarly to the bottom surface 35*b* of the printer holder 35 in the first exemplary embodiment, the bottom surface of the lower-side holder part 37 is shaped to cover approximately the half of the bottom surface of the portable printer 1 in the depth direction D. Additionally, tops of a pair of lateral surfaces 37*a* of the lower-side holder part 37 are located lower than the positions of the adapter connection terminal 10 and the battery cover 11. Hence, unlike the printer holder 35 in the first exemplary embodiment, the pair of lateral surfaces 37*a* is not provided with the hole portion 35*g* and the cutout portion 35*h*.

A pair of protrusions 37*b* of the lower-side holder part 37 is a pair of parts for covering part of a lower region of the front surface of the portable printer 1. The pair of protrusions 37*b* is shaped to partially protrude from the same sides as the lateral surfaces of the portable printer 1 to the same side as the front surface of the portable printer 1. The pair of the protrusions 37*b* is covered with the pair of the protrusions 31*b* of the storage case 30.

In the present exemplary embodiment herein described, it is possible to achieve not only advantageous effects similar to those achieved in the aforementioned first exemplary embodiment but also the following advantageous effects. In short, the front-side holder part 36 is provided to be bridged between the pair of the protrusions 31*b* of the storage case 30, whereby it is possible to prevent deformation of the storage case 30 from its original shape and keep the storage case 30 in a good posture.

Based on the exemplary embodiments, the present invention made by the inventor of the present application has been specifically explained above. It should be understood that the exemplary embodiments disclosed in the present specification are exemplary only in all aspects and the present invention is not limited to the technology herein disclosed. In other words, the technical scope of the present invention should not be interpreted restrictively based on the explanation in the aforementioned detailed description, rather should be interpreted based on the description of claims, and encompasses equivalents of the technology described in the claims and all the changes made without departing from the gist of the claims.

For example, the aforementioned exemplary embodiments have explained the construction that the outer peripheral part of the surface fastener on the flap plate provided on the tip end of the upper cover is covered with the bias tape. However, a target to be covered with the bias tape is not limited to this, and the outer peripheral part of the surface fastener on the tip end of the lower cover may be covered with the bias tape.

Additionally, in the aforementioned exemplary embodiments, the printer holder is provided for covering the back surface, the both lateral surfaces, part of the front surface and part of the bottom surface of the portable printer. However, the printer holder may be suitably constructed as long as it covers at least part of the front surface and the lateral surfaces of the portable printer. For example, the printer holder may be composed without a back surface, i.e., may be composed of a pair of lateral surfaces, a pair of protrusions and a bottom surface. Alternatively, the printer holder may be composed without the bottom surface, i.e., may be composed of a pair of lateral surfaces, a pair of protrusions and a back surface. Additionally, the back surface of the printer holder may be made in a band-like shape so as to be bridged between the pair of the lateral surfaces.

Moreover, the aforementioned exemplary embodiments have explained that a continuous paper, in which a plurality of labels are temporarily attached to a paper mount, is used as a print medium. However, the print medium is not limited to this. For example, a strip of continuous labels having an adhesive surface on one side (mountless label) or a continuously produced sheet without any adhesive surface (continuous sheet) is usable as the print medium, and not only a paper medium but also a film or so forth printable by a thermal head is usable as the print medium.

INDUSTRIAL APPLICABILITY

In the aforementioned explanation, the present invention is applied to a type of printer configured to eject printed labels attached to a paper mount without separating the printed labels from the paper mount. However, an application target of the present invention is not limited to this. For example, the present invention may be applied to a type of printer having a separation ejection function to eject printed labels after the printed labels are separated from a paper mount.

The invention claimed is:

1. A storage case for a portable printer, comprising:

a case body configured to store the portable printer, the case body enabling an ejection port surface of the portable printer to be exposed therethrough, the ejection port surface being provided with an ejection port to eject a print medium after printing of the print medium;

an opening and closing member mounted to the case body, the opening and closing member being configured to open and close on a side of the ejection port surface; and a holder for holding the portable printer, the holder being mounted to be fixed to the case body, the holder configured for covering part of the ejection port surface of the portable printer, wherein the case body and the opening and closing member are configured for covering the holder, the holder is formed so as to cover a portion of the ejection port surface and a lateral surface of the portable printer, and the holder includes a first opening for replacing a battery of the portable printer therethrough.

2. The storage case for a portable printer according to claim 1, wherein the holder is made of a harder material than the case body.

3. A storage case for a portable printer, comprising:

a case body configured to store the portable printer, the case body enabling an ejection port surface of the portable printer to be exposed therethrough, the ejection port surface being provided with an ejection port to eject a print medium after printing of the print medium;

an opening and closing member mounted to the case body, the opening and closing member being configured to open and close on a side of the ejection port surface; and a holder for holding the portable printer, the holder being mounted to be fixed to the case body, the holder configured for covering part of the ejection port surface of the portable printer, wherein the case body and the opening and closing member are configured for covering the holder, the holder is formed so as to cover a portion of the ejection port surface and a lateral surface of the portable printer, and the holder includes an opening for connecting an interface connector to the portable printer therethrough.

4. The storage case for a portable printer according to claim 3, wherein the holder includes a first opening for replacing a battery of the portable printer therethrough.

5. The storage case for a portable printer according to claim 3, wherein the holder is made of a harder material than the case body.

6. A storage case for a portable printer, comprising:

a case body configured to store the portable printer, the case body enabling an ejection port surface of the portable printer to be exposed therethrough, the ejection port surface being provided with an ejection port to eject a print medium after printing of the print medium;

an opening and closing member mounted to the case body, the opening and closing member being configured to open and close on a side of the ejection port surface; and a holder for holding the portable printer, the holder being mounted to be fixed to the case body, the holder configured for covering part of the ejection port surface of the portable printer, wherein the case body and the opening and closing member are configured for covering the holder, the holder is formed so as to cover a portion of the ejection port surface and a lateral surface of the portable printer, the holder includes a pair of first protrusions protruding from respective sides of lateral surfaces of the portable printer along the ejection port surface side so as to cover part of the ejection port surface, the case body includes a pair of second protrusions protruding from respective sides of lateral surfaces of the portable printer along the ejection port surface side so as to cover the pair of first protrusions of the holder, and the opening and closing member and the pair of second protrusions are provided with surface fasteners on respective facing surfaces thereof, the surface fasteners enabling the opening and closing member and the pair of second protrusions to be attached to or detached from each other.

7. The storage case for a portable printer according to claim 6, wherein the opening and closing member includes a lower cover configured to open and close at a lower side of the ejection port surface, and an upper cover configured to open and close at an upper side of the ejection port surface.

8. The storage case for a portable printer according to claim 7, wherein the lower cover is configured to be openable and closable in conjunction with an opening and closing motion of an opening and closing cover of the portable printer, the opening and closing cover being configured to open and close a supplying part provided for the print medium in an interior of the portable printer.

9. The storage case for a portable printer according to claim 6, wherein the holder is made of a harder material than the case body.

10. The storage case for a portable printer according to claim 6, wherein the holder includes a first opening for replacing a battery of the portable printer therethrough.

* * * * *